United States Patent [19]
Swoboda

[11] Patent Number: 5,828,824
[45] Date of Patent: Oct. 27, 1998

[54] METHOD FOR DEBUGGING AN INTEGRATED CIRCUIT USING EXTENDED OPERATING MODES

[75] Inventor: Gary L. Swoboda, Sugarland, Tex.

[73] Assignee: Texas Instruments Incorporated, Dallas, Tex.

[21] Appl. No.: 766,660

[22] Filed: Dec. 16, 1996

[51] Int. Cl.[6] .................................................. G06F 11/25
[52] U.S. Cl. ................. 395/183.01; 395/183.06; 395/183.22; 395/183.14; 395/183.17
[58] Field of Search ......................... 395/183.01, 183.14, 395/183.17, 183.22, 183.06

[56] References Cited

U.S. PATENT DOCUMENTS

| | | | |
|---|---|---|---|
| 4,701,921 | 10/1987 | Powell et al. | 371/22.32 |
| 4,860,290 | 8/1989 | Daniels et al. | 371/22.31 |
| 5,072,418 | 12/1991 | Boutaud et al. | 364/715.06 |
| 5,285,153 | 2/1994 | Ahanin et al. | 324/158 |
| 5,329,471 | 7/1994 | Swoboda et al. | 364/578 |
| 5,535,331 | 7/1996 | Swoboda et al. | 395/183.21 |
| 5,564,028 | 10/1996 | Swoboda et al. | 395/183.21 |
| 5,568,493 | 10/1996 | Morris | 371/22.3 |
| 5,630,049 | 5/1997 | Cardoza et al. | 395/183.01 |
| 5,680,620 | 10/1997 | Ross | 395/704 |
| 5,682,472 | 10/1997 | Brehm et al. | 395/183.01 |

OTHER PUBLICATIONS

"The Implementation and Application of Micro Rollback in Fault–Tolerant VLSI System," IEEE, 1988, pp. 234–239.
"A Survey of Design for Testability Scan Techniques," VLSI Design, Dec. 1984, pp. 38–,39,42,46,48,59–61.
"TMX320C6201 Digital Signal Processor," Texas Instruments Products Preview, Jan. 1997, p. 1.
"TMS320C62xx CPU and Instruction Set,," Texas Instruments Reference Guide, 1997, p. 1.

*Primary Examiner*—Robert W. Beausoliel, Jr.
*Assistant Examiner*—Pierre E. Elisca
*Attorney, Agent, or Firm*—Gerald E. Laws; Robert D. Marshall, Jr.; Richard L. Donaldson

[57] ABSTRACT

A method of testing an integrated circuit 104 which may have multiple modules 204a–d is provided. Target interface 200 provides an interface for connecting target system 104 to a test system which is an extension of IEEE 1149.1. Target system 104 may have multiple devices 202, each having multiple modules 204. Each device 202 has device interface 210 which connects to target interface 200. Decoder 1020 decodes certain signals from interface 200 to enable Extended Operating Modes which allow test codes to be easily directed to any one of modules 204a–d. Hardware and software debugging of system 104 is aided by interface 200 and production testing of system 104 is simplified.

7 Claims, 9 Drawing Sheets

METHOD FOR DEBUGGING AN INTEGRATED CIRCUIT USING EXTENDED OPERATING MODES

TECHNICAL FIELD OF THE INVENTION

The present invention relates generally to the testing of large scale integrated circuits, and more particularly to methods and apparatus for testing such integrated circuits.

BACKGROUND OF THE INVENTION

As the technology for manufacturing integrated circuits advances, more and more logic functions may be included in a single integrated circuit device. Modern integrated circuit (IC) devices include over 100,000 gates on a single semiconductor chip, with these gates interconnected so as to perform multiple and complex functions, such as, for example, those in a general-purpose microprocessor. The manufacture of such circuits incorporating such Very Large Scale Integration (VLSI) requires that the fabrication of the circuit be error free, as some manufacturing defects may prevent it from performing all of the functions that it is designed to perform. This requires verification of the design of the circuit and also various types of electrical testing after manufacture.

Development of a test program for an IC and debugging of that program can be very time consuming and costly unless designers consider test issues during the logic design phase. Due to the increased complexity of VLSI chips, it is generally not feasible for test engineering to independently develop and debug programs. The responsibility now lies with logic designers to design logic such that it is easy to test and such that it requires a reduced set of so-called test "vectors" to thoroughly test the design.

However, as the complexity of the circuit increases, so does the cost and difficulty of verifying and electrically testing each of the devices in the circuit. From an electrical test standpoint, in order to totally verify that each gate in a VLSI circuit functions properly, one must ideally be able to exercise each of the gates not only individually (in the digital sense, determining that it is neither stuck-open nor stuck-closed), but also in conjunction with the other gates in the circuit in all possible combinations of operations. This is normally accomplished by automated testing equipment (ATE) that employs test vectors to perform the desired tests. A test vector describes the desired test input (or signals), associated clock pulse (or pulses), and expected test output (or signals) for every package pin during a period of time, often in an attempt to "test" a particular gate (or macro). For complex circuitry, this may involve a large number of test vectors and accordingly a long test time. Macro and cell are used herein to mean the same thing and may be used interchangeably.

In addition, specific circuit configurations in the VLSI circuit may have some of its gates inaccessible for all but a special combination of signals, thereby hiding a fault unless a very specific pattern of signals is presented. However, the cost of performing such testing on 100% of the manufactured circuits is staggering, considering the high cost of the test equipment required to exercise each circuit in conjunction with the long time required to present each possible combination to each gate. This has in the past forced integrated circuit manufacturers to test less than all of the active devices in a chip, with the attendant quality levels of the product being less than optimal. Thus, one of the major problems in integrated circuit design is the ability to adequately test the IC design, and this problem increases with increasing complexity of the integrated circuit.

One way to address this problem is through design for test (DFT). The key concepts in DFT are controllability and observability. Controllability is the ability to set and reset the state of every node in the circuit, while observability is the ability to observe either directly or indirectly the state of any node in the circuit. The purpose of DFT is to increase the ability to control and observe internal and external nodes from external inputs/outputs. That is, DFT techniques may be employed for logic verification and DC parametric tests.

Designing testability into any circuit will affect the circuitry to some degree. Additional logic will probably have to be added. This additional logic will increase the amount of silicon required to implement the design. The savings from enhanced testability do not usually show up until the development time and testing costs of the circuit and its end system are analyzed.

Circuit designers have used stuck-fault modeling techniques in improving the efficiency of the testing of such VLSI circuits. Stuck-fault modeling is directed not to stuck-open or stuck-closed defects in individual gates, but to the effect of such defective gates (and defective interconnections) resulting in stuck-high and stuck-low nodes of the logic circuit. Minimum patterns of test vectors are then derived for the exercising of the logic circuit. Applying such test vectors to the circuit detects stuck-high and stuck-low nodes if defects are present. Such techniques have been successful in improving the test efficiency of current generation VLSI circuits.

In conjunction with the stuck-fault modeling and associated test generation, other circuitry may be included in the VLSI circuit specifically designed to improving its testability. One type of test circuitry is a scan path in the logic circuit. A scan path consists of a chain of synchronously clocked master/slave latches (or registers), each of which is connected to a particular node in the logic circuit. These latches can be loaded with a serial data stream ("scan in") presetting the logic circuit nodes to a predetermined state. The logic circuit then can be exercised in normal fashion, with the result of the operation (at each of the nodes having a scan latch) stored in its respective latch. By serially unloading the contents of the latches ("scan out"), the result of the particular test operation at the associated nodes is read out and may be analyzed for improper node operation. Repetition of this operation with a number of different data patterns effectively tests all necessary combinations of the logic circuit, but with a reduced test time and cost compared to separately testing each active component or cell and all their possible interactions. Scan paths permit circuit initialization by directly writing to the latches (or registers) and directly observing the contents of the latches (or registers). Using scan paths helps to reduce the quantity of test vectors compared to traditional "functional mode" approaches. Techniques for scanning such data are discussed by E. J. McCluskey in "A Survey of Design for Testability Scan Techniques", VLSI Design (Vol. 5, No. 12, pp. 38–61, December 1984).

Also as VLSI technology is advancing, users of integrated circuits are desiring specially designed and constructed integrated circuits, for performing functions customized for the user's application. Such integrated circuits have been called Application-Specific Integrated Circuits (ASICs). For an ASIC device to be cost-competitive with general purpose microcomputers which may have special functions implemented in programmable firmware, and cost-competitive with a board design made up of smaller scale integrated circuits, the design time of the ASIC circuit must be short and the ASIC circuit must be manufacturable and testable at low cost. Accordingly, it is useful for such circuits to be modular in design, with each of the modules performing a certain function, so that a new ASIC circuit may be constructed by combining previously-designed circuit modules. Such an approach can also be used for non-ASIC microcomputers and microprocessors. Regardless of the end product, the use of a modular approach allows the designer to use logic which has previously been verified, and proven manufacturable. However, if logic modules containing existing scan paths are placed into a new circuit application, new test patterns will generally be required for the new device, thereby lengthening the design/manufacture cycle time.

A modular approach to utilizing scan paths and other testability circuits has been used to provide thorough coverage of all possible faults in an efficient manner. However, this approach utilizes system buses to set up and operate the scan test, so that even though each module is tested independently, the test pattern designed for a given module depends upon the operation of other modules in the logic circuit for purposes of bus control and module selection. This results in the testability of a particular module depending upon the fault-free operation of other modules. In addition, the ATPG program which sets the conditions for test of a given module depends upon the position of the module relative to other modules, and upon the operating features of such other modules. While reduced test times and costs are thus achieved by such modularity, the use of system buses to load and unload the scan paths in the individual modules may not only affect the operation of the particular module, but is likely to also preclude "porting" of the test program for a given module from one logic circuit to another.

Recently, MegaModules have been used in the design of ASICs. (MegaModule is a trademark of Texas Instruments Incorporated.) Types of MegaModules include SRAMs, FIFOs, register files, RAMs, ROMs, universal asynchronous receiver-transmitters (UARTs), programmable logic arrays and other such logic circuits. MegaModules are usually defined as integrated circuit modules of at least 500 gates in complexity and having a complex ASIC macro function. These MegaModules may be predesigned and stored in an ASIC design library. The MegaModules can then be selected by the designer and placed within a certain area on the desired IC chip. This allows ASIC designers to integrate MegaModules into their logic as easily as simple macros.

Conventionally, these MegaModules are available as standard catalog devices and are designed without testability. In order to test the ASIC, a custom test program must be developed for that particular chip. Because a custom testing program has to be devised for each custom chip, the costs associated therewith are greater than desired.

More recently, peripheral cells have been provided for input and output during normal operation of the chip, and also for input and output of testing signals for a testing program. These peripheral cells are typically of input, output, and input/output types. Testing programs have been previously devised that use input cells for the input test terminals and output cells for the output test terminals. This has the disadvantage of restricting the number of test pins of any type to the number of available signal pins of the same type.

Another solution to this testing problem of an ASIC is the use of a so-called Parallel Module Test (PMT), which is often referred to as a "direct connect" scheme. (Parallel Module Test is a trademark of Texas Instruments Incorporated.) PMT is a direct connect scheme, because it connects external pins to a MegaModule bypassing all other logic, buffers, etc. It is primarily intended as a logic verification testability scheme and has recently been enhanced to address limited VIH/VIL and ICCQ testability schemes. However, even PMT may have problems since the logic states of the ASIC's circuitry may be disturbed as part of the test process during test selection and enabling.

Another solution is the test access port and boundary-scan architecture defined by the IEEE 1149.1 standard, a so-called JTAG test port. IEEE 1149.1 is primarily intended as a system test solution. The IEEE 1149.1 standard requires a minimum of four package pins to be dedicated to the test function. The IEEE 1149.1 standard requires boundary scan cells for each I/O buffer, which adds data delay to all normal operation function pins as well as silicon overhead. Although it has "hooks" for controlling some internal testability schemes, it is not optimized for chip-level testing. IEEE 1149.1 does not explicitly support testing of internal DC parametrics.

For a manufacturer, DC parametrics are just as important to the test process as is logic verification testing, which was described earlier herein. In general, DC parametric tests are employed to evaluate the quality of the fabrication of the individual gates and their interconnections, rather than testing their logical operation as the earlier described tests perform. A test engineer must evaluate the test patterns to find appropriate test vectors where the device is in a state suitable for the performance of DC parametric tests. In conventional logic tests, opportunities for conducting DC parametric tests are scattered throughout the test patterns. What is needed is a simpler, easier, and faster way to generate efficient test patterns useful to perform DC parametric tests.

Many testability schemes have been described that would increase testing quality and/or reduce test time. A partial list includes the disabling of DC through-current for pullup (PU) and pulldown (PD) cells, directing the output of a VIH/VIL tree to a non-dedicated package pin, forcing a high-impedance state for 3-state I/O buffers, and logic verification of MegaModules via Parallel Module Test. However, there is no common control method defined for all these testability schemes.

As a result silicon efficiency is poor, because the control circuit for each testability scheme has its own unique logic and package pin resource requirements. Design and test engineering efficiency is poor, because few of these testability schemes are well-defined and supported by standard testing software. Finally, new testability schemes cannot capitalize on existing silicon, engineering expertise, and software resources.

In addition, there is no common control technique for all of these various known testing schemes. That is, each test scheme has its own control technique. Even JTAG is unable to control all these test schemes without modification.

These and other disadvantages of the prior art are overcome by the present invention, however, and improved methods and apparatus for chip-level testing, as well as system-level testing, are provided.

SUMMARY OF THE INVENTION

A method of operating an integrated circuit which has a target system debug interface is provided. At power up, a code is applied to the target system interface which selects an operational mode for the integrated circuit, which may be a test mode or a normal operation mode. At any time after power up, another code may be applied on the target system interface and be enabled by a selected signal to place the integrated circuit into one of a number of extended operating modes which can enable various hardware circuits and modes to assist in factory testing, printed circuit board testing, and target system code debugging.

It is an object of the present invention to provide a test access port for ICs.

It is also an object of the present invention to provide a test access port for a system employing ICs.

It is another object of the present invention to provide a test access port architecture that allows utilization of existing test schemes while allowing for utilization of future test schemes as they are developed.

It is yet another object of the present invention to provide methods and apparatus for an improved test access port.

It is also an object of the present invention to provide methods and apparatus for an improved test access port that employ one dedicated test pin and a plurality of shared test pins.

It is further an object of the present invention to provide methods and apparatus that initiate a test feature using signals on only one external pin.

It is yet a further object of the present invention to provide methods and apparatus that employ shared test pins to load test information without disturbing core logic.

These and other objects and advantages of the present invention will become apparent from the following detailed description wherein reference is made to the Figures in the accompanying drawings.

BRIEF DESCRIPTION OF THE DRAWINGS

A more complete understanding of the present invention may be derived by referring to the detailed description and claims when considered in conjunction with the accompanying drawings in which like reference numbers indicate like features throughout the drawings, and wherein:

DETAILED DESCRIPTION

Figure 1:
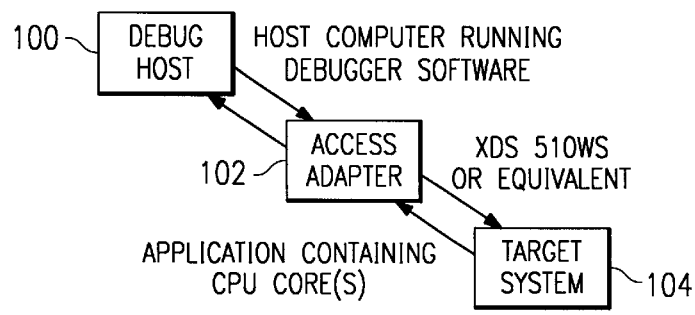
FIG. 1 is a block diagram of a debug environment with an interface to a target system according to the present invention.

Various inventive electronic architectures, devices, systems and methods related to a test system host and test adapter were described extensively in the detailed description and drawings of the commonly assigned application with U.S. Pat. No. 5,329,471. This foregoing commonly assigned application is incorporated herein by reference. The present invention is an improvement on the structure of the IEEE 1149.1-1990 "Standard Test Access Port and Boundary Scan Architecture," which is incorporated herein by reference. Terms and concepts relating to IEEE 1149.1 which are used herein are explained fully in this IEEE standard.

A device debug interface plays a vital role in target system software and hardware debug. Host debug stations, with debug software executing on the host computer, connect to this interface creating a powerful development tool. The debug architecture according to the present invention avoids many of the problems encountered with conventional emulators, minimizing the product development cycle and accelerating production of volume orders of integrated circuit products.

The present inventive approach combines the board test, imbedded core test, and target system hardware and software debug requirements into one solution. Each or these areas has special needs and the operating modes required to support each must not interfere with each other. Since chip pin count is a very important parameter in system designs, utilizing a minimum number of pins to invoke all the chip and systems related test functions is a must.

The approach disclosed in this document addresses the varied requirements of board level boundary scan testing, imbedded core testing, and testing of memory modules imbedded in ASIC class devices. It encompasses the increasing integration of system level functions onto a single chip while preserving the individuality of Mega modules during chip production testing. An advantage of the present invention is the elimination of collisions between test modes and code development capabilities, which will be described fully.

Another advantage of the present invention is production test modes used by the IC manufacturer can utilize the device pin out (including the IEEE 1149.1 or JTAG) interface in something other than their functional configuration. This reusability of the system test interface for production testing of the IC provides sorely needed device pin count relief and standardizes test methodologies.

The IEEE 1149.1 standard provides a communication protocol that allows the selection of one or more devices imbedded within a system. This protocol implements the primitives necessary to control on chip debug and test facilities. The debug interface of the present invention adds two additional terminals (nET1 and nET0) to the five terminal version of the standard IEEE interface (nTRST, TCK, TMS, TDI, and TDO). Including nTRST in the debug interface definition simplifies system design as this terminal, when held LOW, generates an asynchronous reset to the test and debug logic of each device within the system. This guarantees normal system operation. This also eliminates the need for the system to provide a continuously running TCK. However, it is strongly recommended that chip designs containing CPU cores have an nTRST terminal that is held low during system operation where there is no connection to a scan controller.

The debug interfaces of the present invention contain hardware extensions to the standard IEEE interface, providing more advanced debugging and production test features. Although the IEEE standard targets testing board or system level interconnect, extensions to its functionality can do much more. Four significant extensions add to the baseline IEEE function, as follows: debug facilities, multiple scan technologies, trigger channels through two additional terminals, and extended operating modes (EOMs). The following paragraphs briefly describe each of these four extensions.

Debug Facilities: Development tools use the debug interface to control the execution flow of an application program and to view or modify CPU registers, peripheral registers, and system memory. Built in debug facilities provide both stop mode and real-time debug environments. Specialized hardware, managed with IEEE interface primitives, provides the execution control for both of these debug modes. Stop-mode debug facilities can halt program execution after any instruction at any point in the program. This provides precise control of all program execution and minimizes the development tool's use of system resources. Real-time debug facilities insulate time critical (interrupt driven) portions from debug activity. These portions of the application continually execute while the remaining portion (less time critical) of the application are debugged in a conventional fashion. Both real-time and stop-mode debug allow program execution to be halted for the following reasons: after single instruction is executed; prior to the execution of instructions identified as breakpoints; after a specific data access (read or write), or; by an asynchronous external request.

Access to Alternate Scan Technologies: Various system designs may contain multiple scan technologies, such as IEEE and proprietary scan architectures, as they offer different technical advantages. Standard IEEE instruction scan, data scan and run test more than one technology. Hardware is added to the device to provide a bridge between IEEE and other scan technologies.

Visibility and Triggering: The IEEE standard does not support the parallel observation of internal chip activity or parallel stimulation of chip activity required for some test and emulation functionality. The addition of two additional terminals (nET1 and nET0) to the debug interface, according to the present invention, address this deficiency. These terminals provide a way to export internal device events and import external debug or test events.

These added I/O terminals provide applications development capability including but not limited to:

Benchmarking applications;

Exporting triggers derived from internal events;

Exporting data during data logging operations;

Exporting internally derived triggers during system debug;

Exporting data during system debug;

Importing triggers derived from external events;

Importing externally derived triggers during system debug

Handshake mechanisms facilitating flash memory programation;

Specifying extended device operating modes during application development;

and production test capability including but not limited to:

Monitoring PSA aliasing;

Observing phase locked loop (PLL) performance;

Observing internal clock generation;

Creating standard power down wake up stimuli;

Exporting test data during production testing;

Specifying extended device operating modes during production test;

Extended Operating Modes: Production test, yield analysis, characterization of device components and target system hardware and software debug require the implementation of various device operating modes. Test mode selection involves one of two methods, indirect (scan sequences) and direct (parallel device terminal transitions). Memory test modes generally use direct selection methods. These tests provide direct access to a memory array or memory and may use memory testers that do not support scan. CPU core tests use indirect methods. Testers use scan to load CPU core tests and specify test modes needed to run them. Testing multiple scannable Mega modules on a device, i.e., two processors, requires the selection and test of one Mega module at a time. This requirement arises from the need to use an unmodified set of module test patterns in all module test environments.

Advantageously, the debug interface of the present invention supports the selection of extended operating modes (EOMs) using the seven IEEE 1149.1 and nETx terminals. In other words, a combination of logic levels applied to the seven terminal debug interface specifies the operating mode of the device.

EOM selection does not interfere with any other debug interface functionality and does not interfere with the operation of the normal IEEE 1149.1 scan activity in system. EOMs, defined in this manner, isolate the testing single Mega modules. This approach maximizes the number of device terminals available for system functions as it uses the debug interface for test mode definition. EOMs can modify the device scan order and other environment attributes, allowing the use of standardized, environment independent module test patterns.

Target Debug Environment

Debugging a system containing a CPU core involves a debug environment, shown in FIG. 1, that connects high level debugging software executing on a host computer to the low level debug interface supported by devices. The debug environment has three parts as shown in FIG. 1: debug host 100, access adapter 102, and target system 104.

The Debug Host 100 is a computer, for example a PC, running a CPU core specific software debugger as one of it's tasks. The debug host allows the user to issue high level commands such as "set breakpoint at location 0x6789", "step one instruction" or "display the contents of memory from 0x1000 to 0x1048". An example host system is described fully in U. S. Pat. No. 5,329,471.

Access Adapter 102 is a hardware component that connects Debug Host 100 to the application. It utilizes one or more hardware interfaces and/or protocols to convert messages created by user interface commands to the debug command. This component could be a Texas Instruments XDS 510WS controller, for example, connected to the target system debug interface and to the PC through a SCSI port. An alternate configuration is a Texas Instruments XDS 510 controller installed in a PC connected to the target system debug interface. An example access adapter is described fully in U.S. Pat. No. 5,329,471.

Target System 104 contains one or more CPU cores. The core(s) contain hardware designed explicitly to ease the chore of debugging. It is the lowest element of the system debug environment. The CPU core debug facilities allow the user to control the program execution, examine the state of the system, memory, and core resources in both real-time and stop mode debug modes. Target System 104 is described in detail in the following paragraphs.

Figure 2:
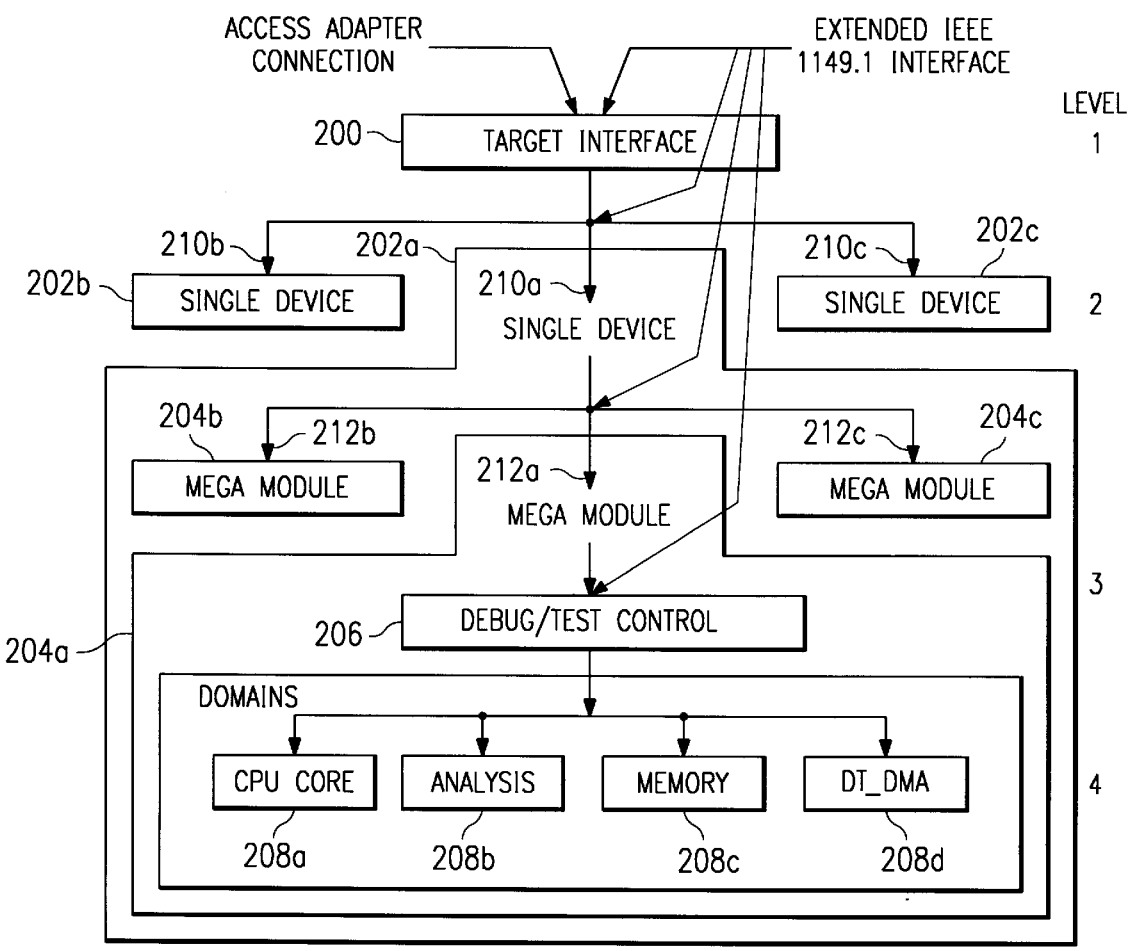
FIG. 2 illustrates a four level Debug Anatomy of target system which includes aspects of the present invention.

FIG. 2 illustrates a four level Debug Anatomy of target system 104. Target system 100 may contain:

Multiple devices 202a–c which contain CPU cores;

Multiple CPU cores within a single device 202a, or;

A single CPU core within a device 202a;

Target 104 is connected to access adapter 102 through a connector which presents an extended IEEE 1149.1 debug interface 200, according to the present invention.

Extended IEEE 1149.1 interface 200 forms the backbone of the target debug anatomy. It traverses the anatomy from the target interface into device(s) 202a–c, connecting to the emulation and test logic blocks within each Mega module 204 that contains a CPU. The interface (less the nETx terminals) may connect to other modules which support IEEE scan compatibility.

User debug directives convert to a series of debug interface primitives. These primitives define IEEE scan activity (instruction and data scans) and IEEE state activity (generation of the IEEE Idle state). Sequences of these primitives direct Debugger/Test Controller (DTC) 206 to perform debug actions. DTC 206 connects to individually controllable subsystem components, such as CPU Core 208a, called domains. DTC 206 generates control and scan actions that interact with the domains. A debug directive causes one or more DTC domain interactions.

The hardware view of the debug target reveals a four level hierarchy, as indicated earlier. Table 1 shows these hierarchical levels.

TABLE 1

Hardware Debug Hierarchy

| # | Name | Description |
|---|---|---|
| 1 | Target Interface 200 | A connector presenting the Extended IEEE 1149.1 interface attached to one or more devices. |
| 2 | Device 202 | One or more Mega modules 204 within a device connected to the Extended IEEE Interface 200 |
| 3 | DTC 206 | A single Mega module's emulation and test interface to the Extended IEEE Interface |
| 4 | Domains 208a-d | Sub modules that are separately controlled by the DTC 206 block. These blocks do not have an Extended Interface |

The target interface and device levels deal primarily with system connectivity, both on and off chip. The DTC and domain levels deal with the specifications and design of imbedded CPU Mega module components.

The first level, the target interface 200, provides the physical connection between the target application and the access adapter. The target system must provide a physical connection with the physical and electrical characteristics which are compatible with the selected access adapter.

The IEEE 1149.1 standard allows the connection of multiple devices in a series or star configuration. The series configuration is by far the most popular configuration and is strongly recommended. This system configuration can contain single or multiple devices containing CPU cores. The debug software and hardware components allow the user to control multiple CPU cores in a global or local manner. This environment provides:

Synchronized global starting and stopping of multiple processors;

Starting and stopping of an individual processor;

Separate debug windows for each processor;

Each processor to generate triggers which may be used to alter the execution flow of other processors;

System topics include but are not limited to:

System clocking and power down issues;

Interconnection of multiple devices;

Trigger channels (nET1 and nET0 connections);

A device 202a generally contains one or more Mega modules 204a–c. Some or all of these modules may contain a CPU core 208a and consequently an Extended IEEE Interface. These interfaces, merged at the device level, combine to form a single Extended IEEE Interface. Additionally, extended operating modes definition takes place at this hierarchy level. Device topics include the following subject areas:

Mega Module Test Issues;

Creation of Extended Operating Modes (EOMs);

Merging multiple Extended IEEE Interfaces (from separate Mega modules) into a single chip level Extended IEEE Interface;

Debug Interface terminal out options;

Each Mega module containing a CPU core also contains Debug and Test Control block (DTC) 206. This block contains the IEEE interface and implements or provides access to the following IEEE interface extensions:

Emulation facilities (Execution control & memory/reg. access);

Access to alternate scan technologies used within the device;

Visibility and triggering;

The DTC block provides a bridge between the Extended IEEE Interface and the debug and test capability distributed through the domains. DTC topics include but are not limited to:

DTC architecture and specifications;

Mega module scan path options;

Execution status management;

IEEE instruction general definition;

Debug interface signal definition;

Domain interface signal definition;

Each Mega module containing a CPU core is divided into a number of domains 208. Domains are independently controllable by the DTC. In other words, one or more domains can be scanned or controlled while other domains continue operate in their normal functional way.

Figure 3:
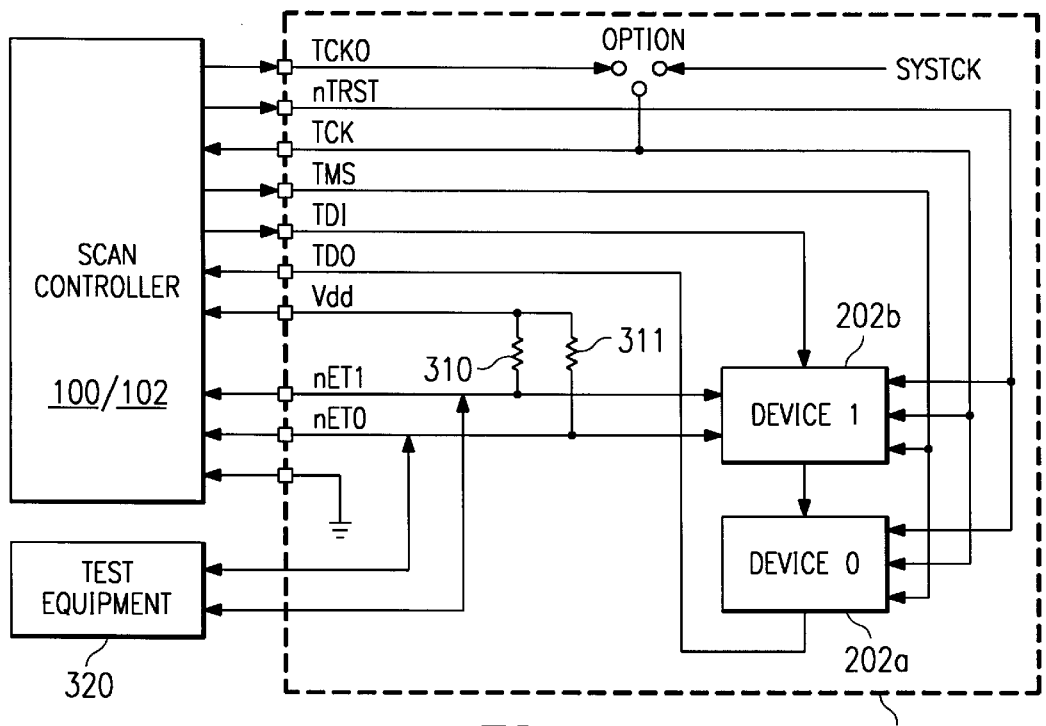
FIG. 3 is a block diagram showing the system connectivity necessary for debugging a target system with one or more devices, one containing a CPU core.

Domain topics include but are not limited to:

Scan path implementation within domains;

Domain interlocks necessary to prevent scanning one domain causing another domain to behave erroneously. For example, scanning the CPU should not cause reads and writes to peripherals or memory;

General module test and debug guidelines;

The example system in FIG. 3 shows the system connectivity necessary for uni-processor debug with one or more devices, one containing a CPU core. This diagram omits signal buffering and other electrical considerations necessary to create a functional system. In this example, target system 104 has a device 1 which contains a CPU core and a device 0 which does not. The two devices 202a–b share a parallel connection to signals nTRST, TCK, and TMS. The scan path begins as TDI at the connector, enters device one, exits device zero, and ends as TDO back at the connector. Connections between device one and connector nET1 and nET0 terminals create trigger channels one and zero.

Controller 102 must supply VDD (Power), GND (Ground), and TCK to the connector. Scan controller 100/102 accommodates the system generation of (SYSTCK) or scan controller generation (TCKO) of TCK.

Figure 4:
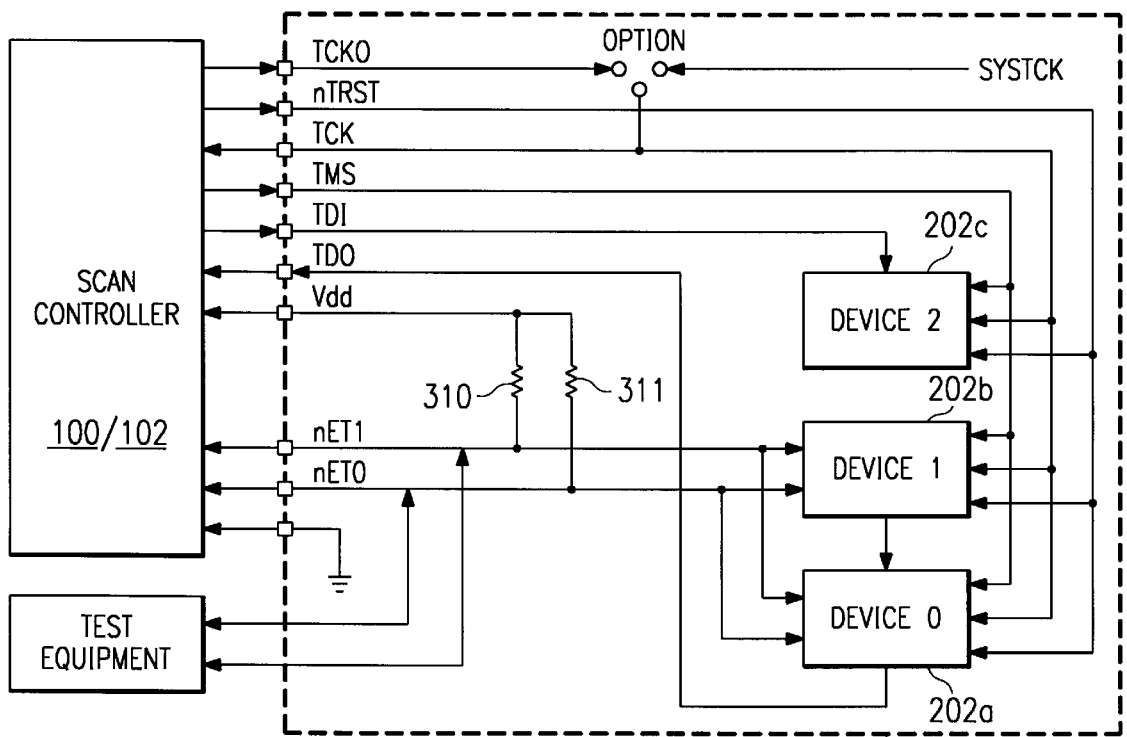
FIG. 4 is a block diagram showing the system connectivity necessary for debug with multiple CPUs in multiple devices.

The example system in FIG. 4 shows the system connectivity necessary for debug with multiple CPUs in multiple devices. This diagram omits signal buffering and other electrical considerations necessary to create a functional system. In this example, device 1 and device 0 contain CPU cores while device 2 does not. The three devices 202a–c share a parallel connection to signals nTRST, TCK, and TMS. The scan path begins at the connector with TDI, enters device 2, passes through device one, and exits device 0 ending as TDO back at the connector. Connections between device 1 and device 0 nET1 and nET0 create trigger channels one and zero.

Controller 102 supplies VDD (Power), GND (Ground), and TCK to the connector and offer the TCK options described in reference to FIG. 3.

The multiprocessing debug environment requires a multitasking operating system on Host 100. Using the multitasking OS framework allows multiple single processor debuggers to be spawned as separate tasks by a global debugger shell. This creates an environment that allows the user to manipulate each processor individually via the single processor debuggers in individual windows or control processors globally via the global execution control directives which are part of the global debugger shell.

Figure 5:
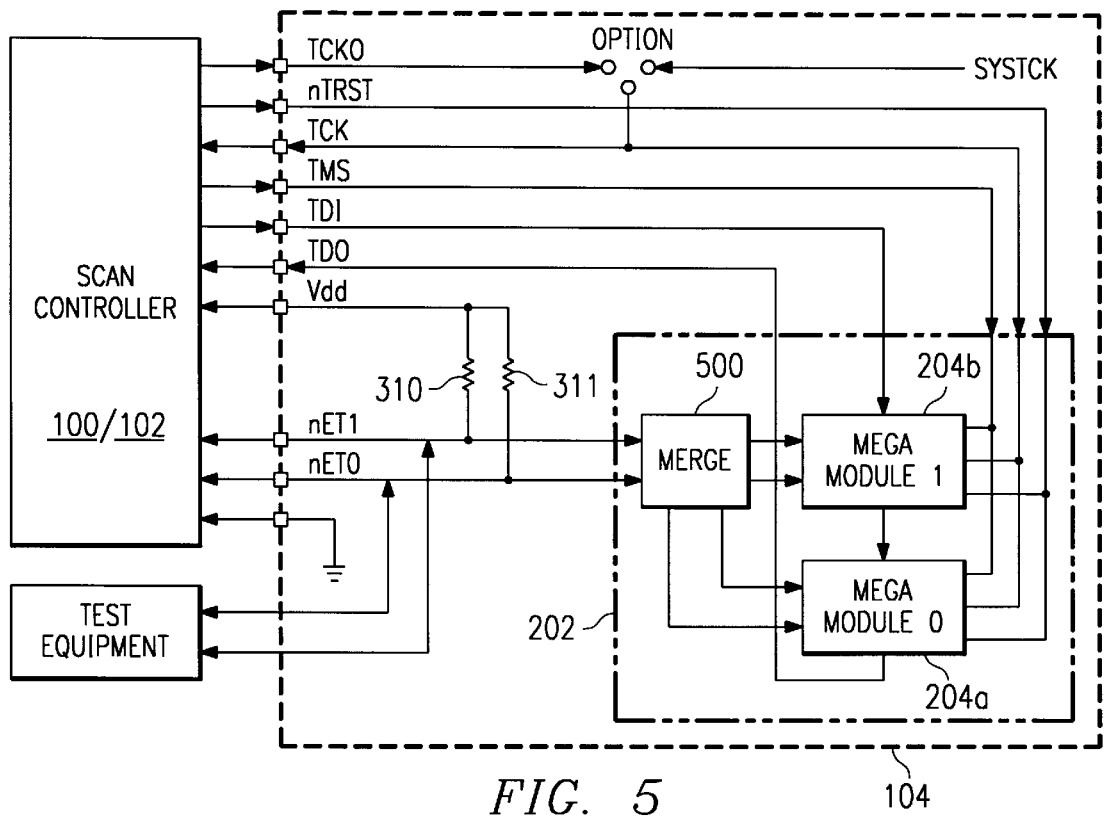
FIG. 5 is a block diagram showing the system connectivity necessary for debug with multiple CPUs in a single device.

The example system in FIG. 5 shows the system connectivity necessary for debug with multiple CPUs in a single device. This diagram omits signal buffering and other electrical considerations necessary to create a functional system. In this example, each Mega module 204a–b contains a CPU core. The two Mega modules 204a–b share a parallel connection to signals nTRST, TCK, and TMS. The scan path begins as TDI at the connector, enters Mega module 1, exits Mega module 0, and ends as TDO back at the connector. Merging Mega module nET1 and nET0 functions within device 202 using merge circuitry 500 creates a single set of nETx terminals at the device debug interface. This creates trigger channels one and zero. The merging process provides a software view of the trigger channels identical to that shown in FIG. 4.

Controller 102 supplies VDD (Power), GND (Ground), and TCK to the connector and offer the TCK options described in reference to FIG. 3.

TARGET INTERFACE

Target interface 200 is the first level of the debug architecture, and will now be described in more detail. The first level, shown in FIG. 2, provides the interface that the access adapter (scan controller) 102 uses to connect to the to the Extended IEEE Interface, the backbone of the Target Debug Anatomy. As discussed earlier, the Extended IEEE Interface according to the present invention provides additional debug features over a conventional IEEE interface.

Figure 6:
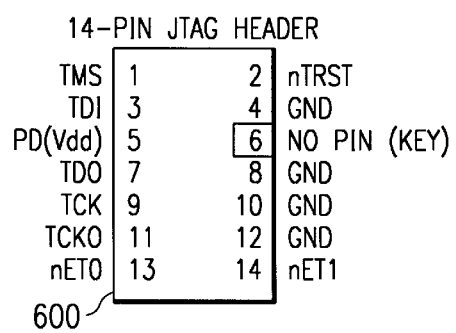
FIG. 6 illustrates a JTAG connector header with additional pins nET0 and nET1, according to the present invention.

The target system generally presents the target debug interface to a Texas Instruments (TI) scan controller 102 on a 14 pin, 50 mil. header. This header, shown in FIG. 6, provides a single point interface between scan controller 102 and target system 104. Access adapter 102 may use different connector configurations or interconnect means, as appropriate, for various system configurations.

The target level debug interface found on the header 600 uses the five standard IEEE 1149.1 (JTAG) signals (nTRST, TCK, TMS, TDI, and TDO) and the two extensions (nET1 and nET0). The 14-pin JTAG header used to interface target system 104 to scan controller 102 also requires Test Clock Out (TCKO), the target supply (VDD) and ground (GND). Note that TCKO is a test clock out of the scan controller, into the target system, which the target system uses if it does not wish to supply it's own test clock (in which case TCKO would simply not be used). In many target systems, TCKO is simply connected to TCK and used as the test clock.

Table 2 and Table 3 provide a description of the target interface debug signals. Signals sourced by target system 104 are outputs (O), those sourced by scan controller 102 are inputs (I), and those signals sourced by either the target system or controller are Inputs/Outputs (I/O).

TABLE 2

JTAG Header Signals As Seen from System 100/102

| Pin | Type | Description |
| --- | --- | --- |
| nTRST | I | Test Logic Reset Not: Causes all test and debug logic in a TI device to be reset along with the IEEE 1149.1 interface. |
| TCK | I | Test Clock: Used to drive IEEE 1149.1 state machine and logic. The same TCK supplied to the devices is supplied to this terminal |
| TMS | I | Test Mode Select: Directs the next state of the IEEE 1149.1 test access port state machine |
| TDI | I | Test Data Input: Scan data input to the device |
| TDO | O | Test Data Output: Scan data output of the device |
| nET1 | I/O | Emulation and Test 1 Not: Helps create trigger channel one. |
| nET0 | I/O | Emulation and Test 0 Not: Helps create trigger channel zero. |

TABLE 3

JTAG Header Signals Not Directly Connected to Devices

| Pin | Type | Description |
| --- | --- | --- |
| TCKO | O | Test Clock Out: A test clock supplied by the scan controller to the target system. This test clock can be used as the system TCK source, or it can be ignored with the TCK source being generated by the target system. |
| PD(Vdd) | I | Target Power Supply: Used as power detect. |
| GND | I/O | Ground |

The five IEEE terminal functions propagate to chips that contain CPU cores or standard IEEE interfaces. The two extension signals nET0-1 propagate to chips that contain CPU modules.

Figure 7:
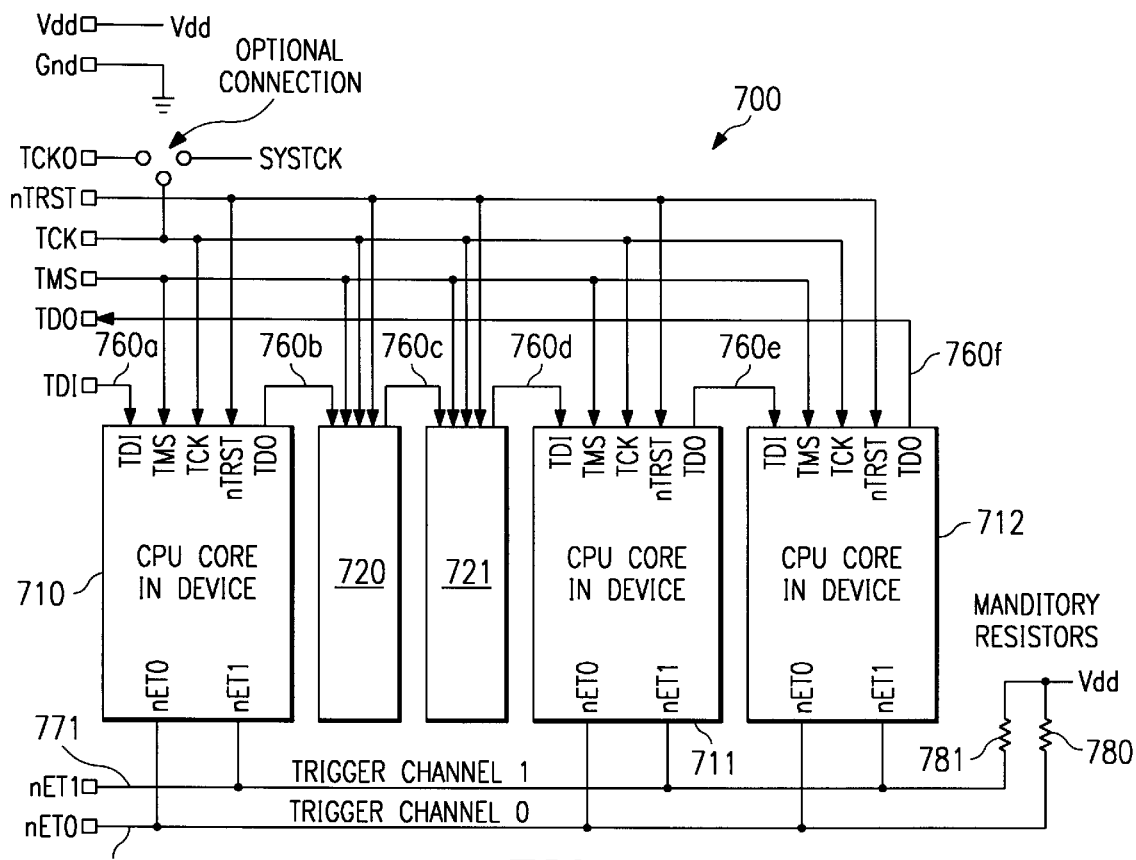
FIG. 7 is a block diagram illustrating debug connectivity in an example target system.

FIG. 7 demonstrates the debug connectivity in an example system 700 containing three devices 710–712 with CPU cores and two other devices 720–721 with IEEE 1149.1 compatible interfaces. This example shows serial scan path 760 threaded through the devices from left to right.

Devices 710–712 containing CPU cores have IEEE 1149.1 extensions nET1 and nET0, according to the present invention. These terminals are general purpose I/O terminals and provide multiprocessing, benchmarking, test, and system observability functions.

Connecting all nET1 and nET0 terminals in parallel forms two independent trigger channels 770–771. The functions assigned to the nETx terminals within each device define the system trigger channel functions. The two trigger channels require 10 KΩ pull-up resistors. All configurations require these resistors or an equivalent pull up device to prevent floating inputs and erroneous device behavior.

A user generated system description file conveys the scan chain order of the devices to the debug software which executes on host 100. This file allows the implementation of any physical device scan order that creates a viable scan path.

Connecting the nET1 and nET0 device terminals to their respective header terminals creates a pair of trigger channels 770–771. These two trigger channels have two operating modes, single owner or multiple owner. Debug software on host 100 and on devices 710–712 assigns an operating mode to each channel based on the trigger function selected. Trigger functions such as benchmarking or data logging require the simultaneous use of both channels while other functions such as breakpoints require a single channel.

The first trigger channel mode, single owner, allows debug software on host 100 to assign channel ownership to a single device. This mode allows the channel owner to export local events to all other devices and scan controller 102. The channel owner (processor) may drive this nETx terminal to either of two states, active (LOW) and inactive (HIGH). Debug software on the other devices forces all other device nETx terminals connected to this channel to assume the disconnected state (HI-Z—High Impedance).

The second trigger channel mode, multiple owner, places device nETx outputs in a wire ORed configuration. This mode allows inter-processor signaling of local events among devices 710–712. In other words, each device connected to the trigger channel may drive the terminal value to one of two values, inactive (LOW) or disconnected (HI-Z) This prevents output drive conflicts. Processors can not drive a shared channel to the inactive state (HIGH), but instead rely on the channel pull-up resistor to establish this state.

Debug software enables processors on devices 710–712 to monitor none, one, or both of the channels, processing active events (LOW logic levels) to stop program execution on a device.

Debug software manages channel ownership across all devices. This can result in any single device:

Sharing one or both trigger channels;

Owning one or both trigger channels, or;

Disconnecting from one or both trigger channels;

A global layer of debug software manages the trigger channel functions when the channel connection includes more than one processor. This avoids dual allocation of the channels.

Hardware circuitry initializes the nETx terminal drive states by making nTRST active or generating the IEEE TAP TLR (Test Access Port Test Logic Reset) state by way of state progression. These two conditions force both nET1 and nET0 (in all devices) to the HI-Z state. They remain in this state until debug software specifies a terminal function that allows the generation of a terminal state other than HI-Z.

Responsibility for nETx terminal behavior and avoidance of drive conflicts rests entirely with the debug software when the IEEE interface is not in the reset state.

The following section contains an example of inter-processor signaling. This sequence defines trigger channel activity generated between two channel stop events.

Initial Conditions: Assume two devices 710–711 share both trigger channels with the initial state of the two channels a logic ONE. All device nETx terminal drivers are in the HI-Z state, leaving the channel pull-up resistors 780–781 to define the inactive channel state (HIGH). Debug software programs each processor to signal the other on one or both of these terminals. Let us also assume an initial condition with both processors stopped and their respective debug acknowledge signals asserted (application stopped). The nETx terminal's HI-Z states, created by software actions to force the terminals to the inactive state, results in the pull-up resistors establishing inactive channel states (HIGH). The forcing action releases the terminals to drive the active state (LOW) after the processor begins to execute code and debug acknowledge returns to its inactive state. In other words, the debug software masks the outputs so they go to the HI-Z level and the processor reaching a state where it normally drives the unmasked terminal level to HI-Z deactivates the mask. The Debug software on each device 710–711 directs each processor to monitor the trigger channels terminals for logic LOW levels and interpret them as breakpoint events.

Running Processors to a Signaling Point: A global run command from host 100 causes both processors 710–711 to start execution roughly simultaneously. One of the processors then executes a software breakpoint instruction. This causes a debug exception. The debug exception causes the enabled nETx terminal to drive its respective trigger channel to a LOW. The second processor detects a LOW value on a monitored trigger channel and stops execution. At this point the second processor also drives one or both nETx terminals to the active state. At this point both processors are driving one or both nETx terminals low.

State Examination and Preparing to Run Again: Two independent debug software packages on devices 710–711 monitor their respective processor status. Each detects the stop condition, reporting this condition to the user. After inspection of the processor states, a global run command directs both processors to begin execution simultaneously. At this point the previous stop conditions remain with one or more of the trigger channels driven LOW. Any processor starting execution would immediately stop again. Debug software uses an inhibit terminal drive feature in each processor to force the nETx terminals to HI-Z state (same feature discussed above). This allows the channels to return to the inactive state as the pull-up resistors create HIGH logic levels on the nETx terminals. The force HI-Z action resets when the processor begins to execute code and debug acknowledge returns to its inactive state. This mechanism creates the nETx terminal high impedance state until inactivation of the debug acknowledge that initially generated the nETx terminal drive LOW condition. The nETx terminals remain in the HI-Z state until one of the processors stops again. This state matches the initial assumptions in this explanation.

Figure 8:
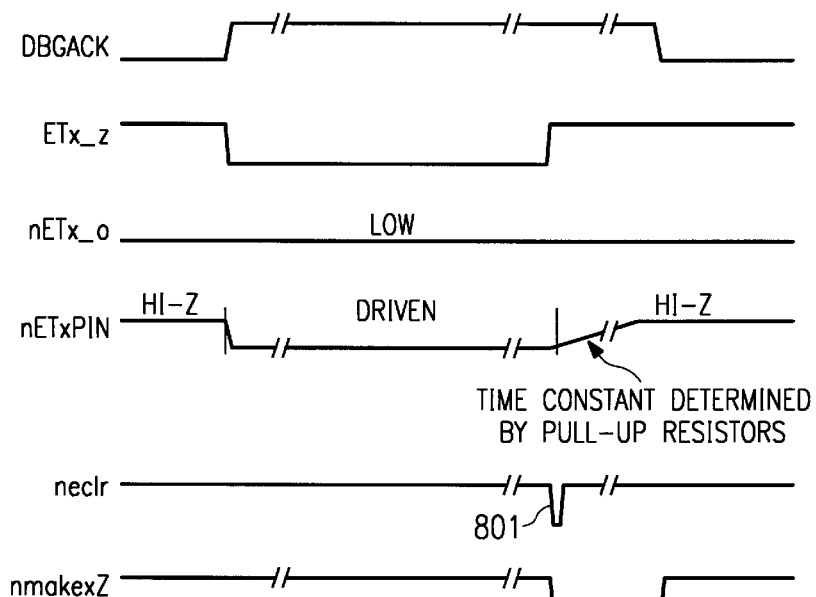
FIG. 8 is a timing diagram illustrating nETx Pin control generated for the restart of program execution on a target system according to the present invention.

FIG. 8 shows the nETx Pin control generated for the restart of execution (nmakeZ). The nETx HI-Z controls (ET1_z and ET0_z) activate when an IEEE 1149.1 IDLE state occurs while the device IEEE 1149.1 instruction register contains the op-code specifying this action (neclr) at time 801. These controls remain in a HIGH state until the processor leaves the debug state.

DEVICE INTERFACE

Device interface 210*a–c* is the second level of the debug architecture, as discussed previously with reference to FIG. 2, and will now be described in more detail.

Referring again to FIG. 2, a typical custom or standard product such as target system 104 combines one or more CPU modules with other standard or custom designed logic modules. Any significant encapsulated part of this function is Mega Module, such as module 204a. Mega Modules may include a CPU core 208a and a debug interface 212a. A CPU core, if present, includes numerous test and application debug facilities 208b which are controlled by Debug/Test Control 206.

Device level debug interface 210 is a subset of the target level interface 200. It contains the five IEEE terminal functions (nTRST, TCK, TMS, TDI, and TDO) and the two extensions (nET1 and nET0), according to the present invention. These functions connect the target interface to one or more device Mega Modules containing CPU cores, as illustrated by device interfaces 210a–c. The five IEEE terminal functions may connect to modules that do not contain CPU cores. These functions maintain the same functionality described in Table 2.

Debug interface 210 has the same function but different signals on each side of the device input and output buffers, as shown in Table 4. Inside the device, HI-Z output functions split into output data and output HI-Z controls. Bi-directional functions split into input data, output data, and output HI-Z controls.

TABLE 4

Internal Device Debug Interface Signal Definition

| Terminal | Type | Description |
|---|---|---|
| nTRST_i | I | Test Logic Reset Not: This active LOW signal asynchronously resets the IEEE 1149.1 interface, test/debug logic in a TI device. This signal must be pulsed or driven low to achieve normal device operation. |
| TCK_i | I | Test Clock: Used to drive IEEE 1149.1 state machine and logic |
| TMS_i | I | Test Mode Select: Directs the next state of the IEEE 1149:1 test access port state machine |
| TDI_i | I | Test Data Input: IEEE data to the device |
| TDO_o | O | Test Data Output: IEEE data from the device |
| TDO_z | O | Test Data Output: IEEE TDO function HI-Z control. When LOW, this signal indicates that serial data is being driven out on the TDO_o terminal. TDO_z normally serves as a LOW active output enable for the TDO terminal function in a packaged part. |
| nET1_o | I | Emulation and Test 1 Out Not: Trigger channel one output. The active state for this signal is LOW |
| nET0_o | I | Emulation and Test 0 Out Not: Trigger channel zero output. The active state for this signal is LOW |
| ET1_z | I | Emulation and Test 1 HI-Z: Trigger channel one HI-Z control. When LOW, this signal indicates that trigger data is being driven out on the nET1_o terminal. ET1_z normally serves as a LOW active output enable for the nET1 terminal function in a packaged part. |
| ET0_z | I | Emulation and Test 0 HI-Z: Trigger channel zero HI-Z control. When LOW, this signal indicates that trigger data is being driven out on the nET0_o terminal. ET0_z normally serves as a LOW active output enable for the nET0 terminal function in a packaged part |
| nET1_i | I | Emulation and Test 1 In Not: Trigger channel one input. |
| nET0_i | I | Emulation and Test 0 In Not- Trigger channel zero input. |

It should be noted that including a power or ground connection to one or more of the debug interface terminals, (nTRST, TCK, TMS, TDI, or TDO) would prevent the use of the development tools and should therefore be avoided. The toolset must be able to drive these terminals to HIGH and LOW logic states.

Figure 9:
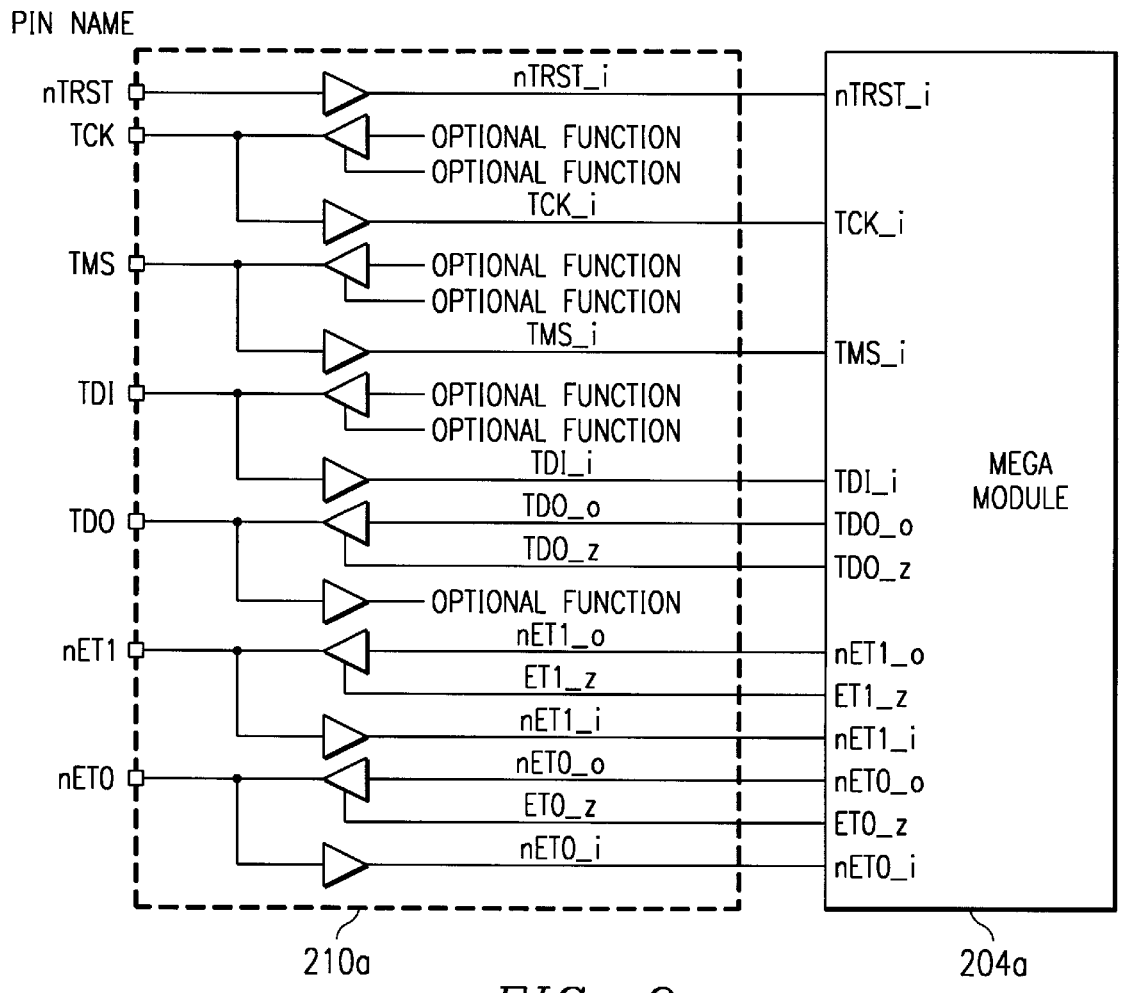
FIG. 9 is a circuit diagram showing a single Mega Module which has one CPU and is connected to a device debug interface according to FIG. 2.

FIG. 9 shows a single Mega Module 204a which has one CPU and is connected to device debug interface 210a. The various signal terminals are as defined in Table 4.

At the device level, the debug interface takes on one of three terminal formats. Each of the three formats supports complete device production testing but provides a different level of in system debug capability. The three terminal out formats define the degree that the debug functions share pins with system functions. Sharing device pins with system functions limits or prohibits the use of device test and debug functions within the end application. The three formats are as follows: non-shared device interface, partially shared device interface, and fully shared device interface. Each format will now be described in detail with reference to Tables 5–7.

Non-Shared Device Debug Interface: This format provides all imbedded test and debug functions in the end system. The assignment of the debug interface function to seven dedicated device pins makes the debug interface continuously available. The device debug functions do not share these pins with any other target system function. Table 5 provides a pin definition.

TABLE 5

Non-Shared Device Debug Interface Pin Definition

| Pin | Type | Description |
|---|---|---|
| nTRST | I | Test Logic Reset Not - Causes all test and debug logic to be reset asynchronously along with the IEEE 1149.1 interface. A continuous LOW logic level applied to this pin guarantees system upsets such as low voltage brownouts, etc. do not place the device in test modes. This is strongly recommended. |
| TCK | I | Test Clock - Used to drive IEEE 1149.1 state machine and logic |
| TMS | I | Test Mode Select - Directs the next state of the IEEE 1149.1 test access port state machine |
| TDI | I | Test Data Input - Scan data input to the device |
| TDO | O | Test Data Output - Scan data out put of the device |
| nET1 | I/O | Emulation and Test Not - E/T Input/Output One |
| nET0 | I/O | Emulation and Test Not - E/T Input/Output Zero |

The non-shared device interface pin out has the following target system attributes:
Continuously asynchronously resets all test and debug logic when no connection is made to this interface (provided the target system or a pull down device within a chip holds nTRST a LOW logic level);
Provides a debug communications interface;
Decouples the system bus rate (operating frequency) from the communications rate (scan frequency);
Makes applications benchmarking available;
Allows processing debug trigger inputs applied to the nET1 and nET0 pins;
Allows the export of trigger outputs via the nET1 and nET0 pins;
The non-shared device interface has the following test specific attributes:
Allows selection of individual Mega Modules for production test with no scan based test pattern modifications;
Allows selection of special operating modes (i.e. PMT-parallel module test) for specialized module test;
Provides in system access to device test capabilities;
Concentrates all test mode definition to seven pins to the Extended Interface;
Creates an extendible IEEE scan architecture (hooks for boundary scan) exit the core;

Provides for test monitoring of test logic i.e. PSA outputs, PLL/OSCILLATOR characteristics Partially Shared Device Debug Interface: This format prevents the in system use of some imbedded application development and test functions such as application benchmarking, internal and external triggering, data logging, etc. The five device pins dedicated to the standard IEEE 1149.1 pin functions provide scan access to the device internals. The IEEE functions do not share these pins with any other system function. The two specialized debug functions (nET1 and nET0), according to the present invention, share device pins with bit I/O functions. When nTRST is active (LOW), these pins implement bit I/O functions. When nTRST is FALSE (HIGH), these pins implement the debug functions assigned to nET1 and nET0. Table 6 provides a pin definition.

TABLE 6

Partially Shared Device Debug Interface Pin Definition

| Pin | Type | Description |
|---|---|---|
| nTRST | I | Test Logic Reset Not - A LOW logic level applied to this pin asynchronously resets the IEEE 1149.1 interface along with all test and debug logic. |
| TCK | I | Test Clock - Used to drive IEEE 1149.1 state machine and logic |
| TMS | I | Test Mode Select - Directs the next state of the IEEE 1149.1 test access port state machine |
| TDI | I | Test Data input - Scan data input to the device |
| TDO | O | Test Data Output - Scan data output of the device |
| nET1/ SYS1 | I/O | Emulation and Test One Not/System Function One - Emulation Input/Output One/System function one |
| nET0/ SYS0 | I/O | Emulation and Test Zero Not/System Function Zero - Emulation Input/Output Zero/system function zero |

The five pins composing shared device interface pin out have the same attributes as the equivalent five non-shared device interface pins. A LOW logic level applied to nTRST assigns bit I/O functions to the nET1/SYS1 and nET0/SYS0 pins. A HIGH logic level applied to nTRST enables the conversion of the nET1/SYS1 and nET0/ SYS0 functions to the Extended IEEE nET1 and nET0 pin functions with scan sequences. The partially shared device debug interface does not support the trigger channel, data logging and benchmarking debug capability provided by the non-shared device interface nET1 and nET0 pins.

The partially shared device debug interface key test related capabilities are the same as those for the non-shared device debug interface since test modes enable the nET1 and nET0 pin functions.

Fully Shared Device Debug Interface: This format prevents the use of all debug and test functions in the end system. A single dedicated pin, TEST—a HIGH active signal, enables test modes and alters the debug interface pin functions. When this pin is inactive (LOW), the seven device debug interface pins take on Bit I/O or other system functions, with all test and emulation functions disabled. When the TEST pin is active(HIGH), these pins assume the functionality of the non-shared device debug interface, with the system functions disabled. TEST is a dedicated interface pin and does not share the pin with a system function. This interface is useful for devices that do not require self emulation. Table 7 provides a pin definition.

TABLE 7

Fully Shared Device Debug Interface Pin Definition

| Pin | Type | Description |
|---|---|---|
| TEST | I | Test: A LOW logic level applied to this pin asynchronously resets the IEEE 1149.1 interface along with all test and debug logic. It also assigns system functions to the other seven interface pins. A high logic level applied to this pin places the device in test mode, with remainder of the pin group assuming the function of the Non-Shared Device Debug Interface |
| nTRST/ SYS6 | I/O | Test Logic Reset Not/System Function Six: A LOW logic level applied to this pin asynchronously resets the IEEE 1149.1 interface along with all test and debug logic/system function six. |
| TCK SYS5 | I/O | Test Clock/System Function Five: Used to drive IEEE 1149.1 state machine and logic/system function five |
| TMS SYS4 | I/O | Test Mode Select/System Function Four: Directs the next state of the IEEE 1149.1 test access port state machine/system function four |
| TDI SYS3 | I/O | Test Data Input/System Function Three: Scan data input to the device/system function three |
| TDO/ SYS2 | I/O | Test Data Output/System Function Two: Scan data out put of the device/system function two |
| nET1/ SYS1 | I/O | Emulation I/O One Not/System Function One: Emulation I/O One/system function one |
| nET0/ SYS0 | I/O | Emulation I/O Zero Not/System Function Zero: Emulation I/O Zero/system function zero |

With the target system normally applying a LOW logic level to the TEST pin, the debug capabilities of a device are disabled within the end system. System functions occupy the shared pins. When TEST is HIGH logic level, the pin functions revert to Non-Shared Device Debug Interface functions. Connecting this debug interface to standard header 600 allows device debug minus the system functions normally assigned to the debug interface.

The Fully Shared Device Debug Interface test related capabilities are the same as those for the Non-Shared Device Debug Interface since a logic HIGH applied to the TEST pin enables the Device Debug Interface pin functions.

Figure 10:
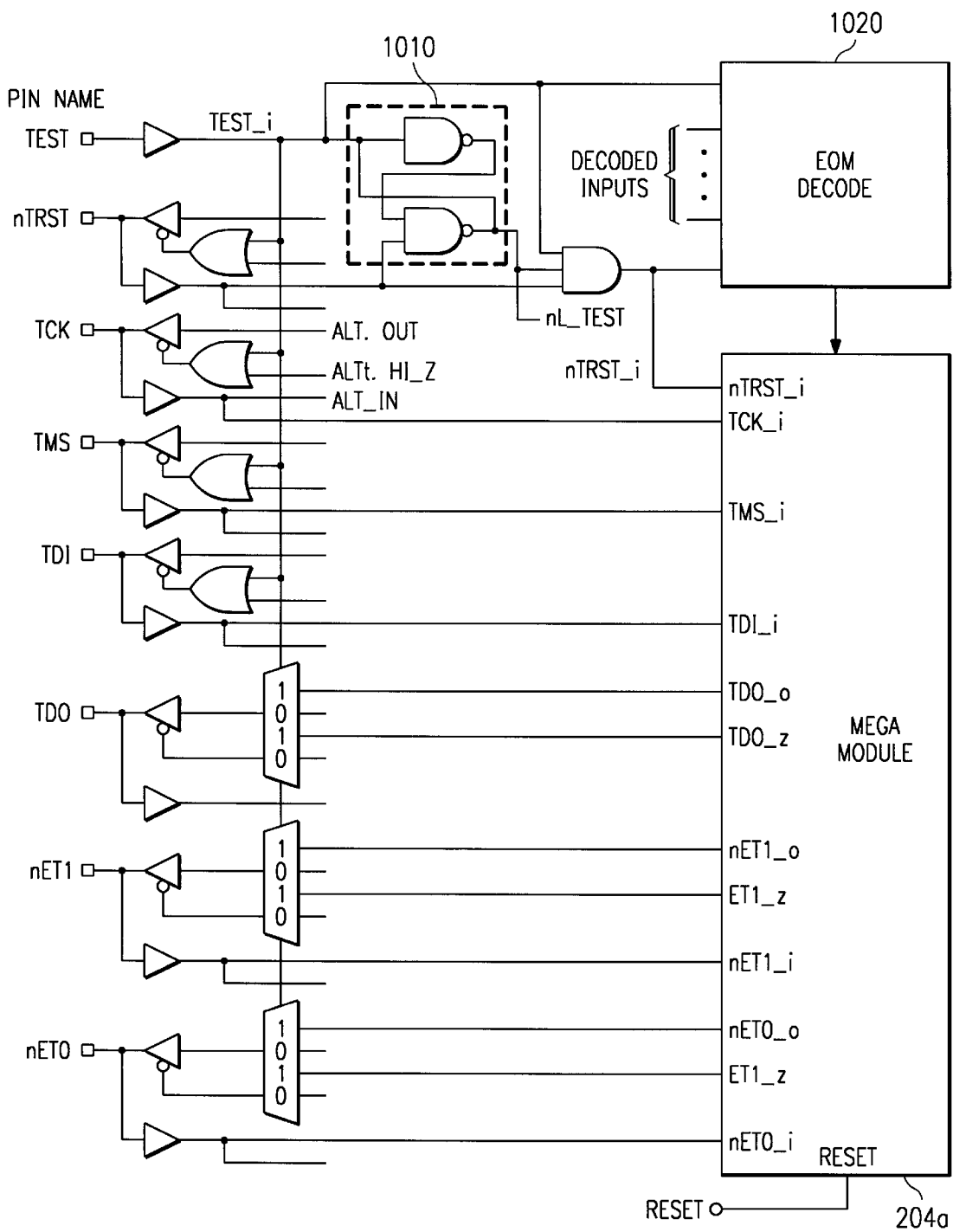
FIG. 10 is a circuit diagram illustrating an example implementation of a Fully Shared Device Debug Interface, according to the present invention.

FIG. 10 illustrates an example implementation of a Fully Shared Device Debug Interface. Note the interlocking of the TEST and nTRST signals via signal Test_i and latch 1010. This interlocking ensures nTRST_i remains active during transitions of the TEST pin. A HIGH applied to TEST makes nTRST_i active. It remains active until a LOW HIGH logic level sequence applied to nTRST causes it to become inactive. This interlocking circuit follows the truth table shown in Table 8.

TABLE 8

TEST and nTRST Interlock Truth Table

| TEST | nTRST | nL_TEST | nTRST_i |
|---|---|---|---|
| 0 | X | X | 0 |
| 0 | 0 | 1 | 0 |
| 0 | 1 | 0 | 0 |
| 1 | 1 | 0 | 0 |
| 1 | 0 | 1 | 0 |
| 1 | 1 | 1 | 1 |

Mega Module Test and Extended Operating Modes (EOMs)

Production test, yield analysis, device debug and software debug can benefit from various extended device operating modes (EOMs). The device debug interface supports the selection of these modes (EOMs) using the seven IEEE 1149.1 and nETx pins. A key aspect of the present invention is that EOMs selection does not restrict or interfere with any other debug interface functionality. EOMs, defined in this manner, isolate the testing of single Mega Modules. This approach maximizes the number of device pins available for system functions as it uses the debug interface for test mode definition. EOMs can modify the device scan order and other environment attributes, allowing the use of standardized, environment independent specific module test patterns.

Another aspect of the present invention is that a combination of logic levels applied to the seven pin debug interface provides a standardized way of specifying EOMs. An EOM decoder 1020, in FIG. 10, decodes the various signal combinations. This method is compatible with various device pin configurations. They address a varied set of test problem, but are not mandatory device features.

Some debug scenarios require a production device operate in a slave mode configuration. This configuration disables the CPU and memory portions of the device while the peripheral portion of the device operates as standalone peripheral chip. This mode of operation (Slave Mode) is an extended operating mode.

EOMs allow the deployment of a mixture of testing methods such as parallel testing of memory modules and scan based testing of CPUs and combinational logic. EOMs permit varied test method deployment without regard to the number or types of Mega Modules used in a system configuration.

The incorporation of EOMs in the test infrastructure allows:

Selecting and testing individual modules with standard serial test patterns;

Selecting and testing individual modules with standard parallel test patterns;

Selecting and testing individual modules with standard mixed serial and parallel test patterns;

Decoupling Mega module testing from the device configuration.

The three device interface formats interact with EOM definition as the interface pin functions characterize each format. Variations in extended operating modes as they relate to each specific interface format will now be described with reference to Tables 9–15.

Two types of EOMs, Combinatorial and Latched, provide different classes of debug capability. Combinatorial EOMs allow definition of the device function from the point of power up. Combinatorial EOMs, generally specified by a Boolean combination of debug interface pins, provide a convenient way of statically generating alternate modes of device operation with no requirements for clocks. These modes include:

Normal;

Slave—Places a device containing a CPU core in a peripheral only configuration;

HI-Z—Provides for HI-Z of all device outputs;

User—Customizable if not defined by CPU core;

Latched EOMs allow redefinition of the device operating mode at any point after power up. An nTRST transition from a LOW to a HIGH latches other debug interface values and combines the latched values with a HIGH value of nTRST to enable a specific Latched EOM mode. From this point, the debug interface use reverts to standard debug activity. Latched EOMs primarily support device production or bench testing devices. Table 9 shows the selection mechanism for both combinatorial and latched EOMs.

TABLE 9

Selection Mechanism for EOMs

| MODE | nTRST | Combination of Interface terminals |
|---|---|---|
| Combinatorial EOM | 0 | 00, 01, 10 |
| Latched EOM | ↑ | 00, 01, 10 |
| Normal mode | 0 | 11 |
| Normal mode | ↑ | 11 |

Combinational EOMs may have functional characteristics as described in the following paragraphs; however, additional EOM characteristics can be included within the scope of the present invention.

SLAVE: Operating a device in slave mode requires a terminal or combination of debug interface terminals specify this mode immediately at power up. Slave mode disables the CPU and memory portions of a device, allowing the peripheral portion of the device to operate as stand alone peripheral chip. Another processor treats the device operating in slave mode as a peripheral chip. A second device, generally a special emulation device or SE, accesses the peripherals within the device placed in slave mode as though they were part of the second device. Slave mode must generate reset to any CPU core.

HI-Z: HI-Z mode supports some board testing methodologies by forcing any or all device terminals (determined by the system designer) to the High Impedance state. A device placed in slave mode requires no connection to development tools.

USER: USER EOM, reserved for user definition, allows system designers a system specific EOM.

NORMAL: NORMAL EOM places the device in its normal operating mode, hence its name. This terminal state, supplied by the scan controller connected to a system, allows development tools to function without selecting any other EOM. The terminals used to enable combinatorial EOMs require pull-ups in the target system (internal or external to the device) and are driven to HIGH logic levels in the production test environment to prevent accidental entry into an unwanted Combinatorial or Latched EOM.

Referring again to FIG. 10, combinational EOMs are decoded by decode circuitry 1020. Module 204a operates in response to the decoded EOM after a system wide reset signal, RESET, is deasserted.

Latched EOMs provide the system designer a convenient way of managing test related issues. They use the device debug interface to create up to 48 different test modes with the Non-shared and Fully-shared interfaces and 12 modes with the Partially-shared interface. This invention does not define the functions of latched EOMs, instead defining the methods and mechanism used to create latched EOMs. The device architect allocates these test modes as needed, providing maximum system flexibility. This approach provides a convenient method of mapping module test modes to the device terminal out without adding extra test pins.

Non-Shared Device Interface: Table 10 identifies the general state of the Non-shared device interface when there is no connection to a scan controller.

TABLE 10

Non-Shared Device Interface Default Pin Values

| nTRST | TCK | TMS | TDI | TDO | nET1 | nET0 |
|---|---|---|---|---|---|---|
| L | X | X | X | X | H | H |

The logic level applied to TCK is HIGH, LOW or a free running clock. A LOW logic level applied to nTRST places TDO, nET1, and nET0 in the HI-Z state. TDI and TDO logic levels are either HIGH or LOW. A pin connection to a pull up resistor internal or external to the device, system logic or VDD establishes a HIGH logic level. A pin connection to a pull down resistor internal or external to the device, system logic or ground establishes a LOW logic level.

Combinatorial EOM definition, shown in Table 11, requires the system provide the default debug interface values shown in Table 10. This is mandatory for devices containing combinatorial EOMs.

TABLE 11

Non-Shared Device Interface EOM Definition

| MODE | nTRST | nET1, nET0 |
|---|---|---|
| Normal | X | XX |
| Combinational: Slave | 0 | 00 |
| Combinational: User | 0 | 01 |
| Combinational: HI-Z | 0 | 10 |
| Normal | X | 11 |
| Latch EOM | ↑ | 00, 01, 10 |
| Activate Latched EOMs | 1 | 00, 01, 10 |

Since nET1, and nET0 are a known value (HIGH) when nTRST is a logic zero (based on interface default values), values of nET1, and nET0 other than all ones identify extended operating modes. The nET1, and nET0 pin values, latched when nTRST transitions from a LOW to HIGH, combine with a HIGH value of nTRST to activate device decodes of latched EOMs modes. Latching TCK, TMS, TDI, and TDO with nTRST and including them in the decode allows definition of additional EOMs. This approach generates a maximum of 48 EOMs. The debug interface pins are a don't care after nTRST rises. The number of EOMs doubles for each additional pin sampled when nTRST rises and include in the EOM decode. Including device pins other than the seven debug interface pins (dedicated inputs present less problems) is acceptable.

LOW to HIGH or HIGH to LOW transitions on nTRST are a don't care when nET1 and nET0 are both HIGH. The logic level applied to these two pins after nTRST is high is a don't care.

Partially-share Device Interface: Table 12 identifies the general state of the partially-shared device interface when there is no connection to a scan controller.

TABLE 12

Partially-share Device Interface Default Pin Values

| nTRST | TCK | TMS | TDI | TDO | nET1/SYS1 | nET0/SYS0 |
|---|---|---|---|---|---|---|
| L | X | H | H | X | X | X |

The logic level applied to TCK is HIGH, LOW or a free running clock. nET1/SYS1 and nET0/SYS0 logic levels are undefined. A LOW logic level applied to NTRST places TDO in the HI-Z state and configures nET1/SYS1 and nET0/SYS0 as Bit I/O. A pin connection to a pull up resistor internal or external to the device, system logic or VDD establishes a HIGH logic level. A pin connection to a pull down resistor internal or external to the device, system logic or ground establishes a LOW logic level.

Combinatorial EOM definition, shown in Table 13, requires the system provide the default debug interface values shown in Table 12. This is mandatory for devices containing combinatorial EOMs Slave, User, HI-Z, Normal and Latched OEM modes provide the same functions the same between non-shared and partially-shared device interfaces, even though the modes are invoked in different ways.

TABLE 13

Partially-Shared Device Interface EOM Definition

| MODE | nTRST | TMS & TDI |
|---|---|---|
| Normal | X | XX |
| Combinational: Slave | 0 | 00 |
| Combinational: User | 0 | 01 |
| Combinational: m-z | 0 | 10 |
| Normal | X | 11 |
| Latch EOM | ↑ | 00, 01, 10 |
| Activate Latched EOMs | 1 | 00, 01, 10 |

LOW to HIGH or HIGH to LOW transitions on nTRST are a don't care when TMS and TDI are both HIGH. The logic level applied to these two pins after nTRST is high is a don't care.

The partially-shared device interface modes supports up to twelve different latched EOM test modes. Latched EOMs, shown in Table 13 require the system to provide the default debug interface values shown in Table 12. This is mandatory when development tools are used with devices containing latched EOMs.

The use of TMS and TDI pin functions to define the EOMs for the partially shared debug interface makes the interface noncompliant with the IEEE 1149.1 specification. Combinatorial and latched EOM definitions make the interface noncompliant with the IEEE 1149.1 specification. Strict IEEE compatibility is generally not required for custom products.

Fully-shared device interface: The general state of the fully-shared device interface with the device in a target system is shown in Table 14.

TABLE 14

Fully-shared Device Interface Default Pin Values

| TEST | nTRST/SYS6 | TCK/SYS5 | TMS/SYS4 | TDI/SYS3 | TDO/SYS2 | nET1/SYS1 | nET0/SYS0 |
|---|---|---|---|---|---|---|---|
| 0 | X | X | X | X | X | X | X |

The logic level applied to TEST is LOW (this keeps the device out of test mode). nTRST/SYS6, TMS/SYS5, TDI/SYS4, TDI/SYS3, TDO/SYS2, nET1/SYS1, and nET0/SYS0 logic levels are don't care. A LOW logic level applied to TEST configures nTRST/SYS6, TMS/SYS5, TDI/SYS4, TDI/SYS3, TDO/SYS2, nET1/SYS1, and nET0/SYS0 as Bit I/O or other system functions. A pull up resistor within the device, an external pull up resistor, system logic or a supply connected to a pin establishes a HIGH logic level. A pull down resistor within the device, an external pull down resistor, system logic or a supply connected to a pin establishes a LOW logic level.

The TEST pin function and EOM definitions for the fully-shared device debug interface make the interface non-compliant with the IEEE 1149.1 specification. The interface remains compatible with only when a HIGH logic level is applied to the TEST pin. Strict IEEE compatibility is generally not required for custom products.

Devices that have no system test or debug requirements can use the fully-shared device debug interface. These devices still must support the EOMs. A logic LOW applied to TEST asynchronously resets all test and debug logic and assigns system functions to test interface pins other than TEST. Applying a HIGH logic level to TEST converts a fully-shared device debug interface to non-shared device debug interface.

A test case executing on host 100 can switch modes by changing the logic level applied to the TEST pin. A test sequence applies a HIGH logic level to load test programs. After completing the load, the tester applies a LOW logic level to change the interface functions to the normal system functions. The test sequence changes the state of the TEST pin from HIGH to LOW after directing the IEEE TAP state machine on Access Adapter 102 to the TLR state (Test Logic Reset state). A HIGH applied to the TEST pin enables the Combinatorial EOMs shown in Table 15.

TABLE 15

EOMs -- Fully-shared Device Interface

| MODE | TEST | nTRST | nET1, nET0 |
|---|---|---|---|
| Normal | 0 | X | XX |
| Combinational: Slave | 1 | 0 | 00 |
| Combinational: User | 1 | 0 | 01 |
| Combinational: m-z | 1 | 0 | 10 |
| Normal | 1 | X | 11 |
| Latch EOM | 1 | ↑ | 00, 01, 10 |
| Activate Latched EOMs | 1 | 1 | 00, 01, 10 |

LOW to HIGH or HIGH to LOW transitions on nTRST are a don't care when nET1 and nET0 are both HIGH. The logic level applied to these two pins after nTRST is high is a don't care.

A HIGH logic level applied to the TEST pin enables the generation of Latched EOMs, making the test interface usable. Supplying the TEST, nET1/SYS1, and nET0/SYS0 pins with a HIGH logic level allows the development tools to use the debug interface. Pin values of nET1/SYS1, and nET0/SYS0 other than both HIGH identify extended operating modes. The nET1/SYS1, and nET0/SYS0 pin values, latched when nTRST transitions from a LOW to HIGH, combine with a HIGH value of nTRST to activate device decodes of latched EOMs modes. Latching TCK, TMS, TDI, and TDO with the nTRST LOW to HIGH transition and including them in the decode allows definition of additional EOMs. This approach generates a maximum of 48 EOMs. The debug interface pins are a don't care after nTRST rises. The number of EOMs doubles for each additional pin sampled when nTRST rises and include in the EOM decode. Including device pins other than the seven debug interface pins (dedicated inputs present less problems) is acceptable.

Devices that have no self debug requirements or requirements to exercise any function by way of an IEEE 1149.1 5 pin interface can use adhoc test methods. A dedicated test pin or other uniquely defined mode definition addresses these needs.

Creating a Single Debut Interface

Figure 11:
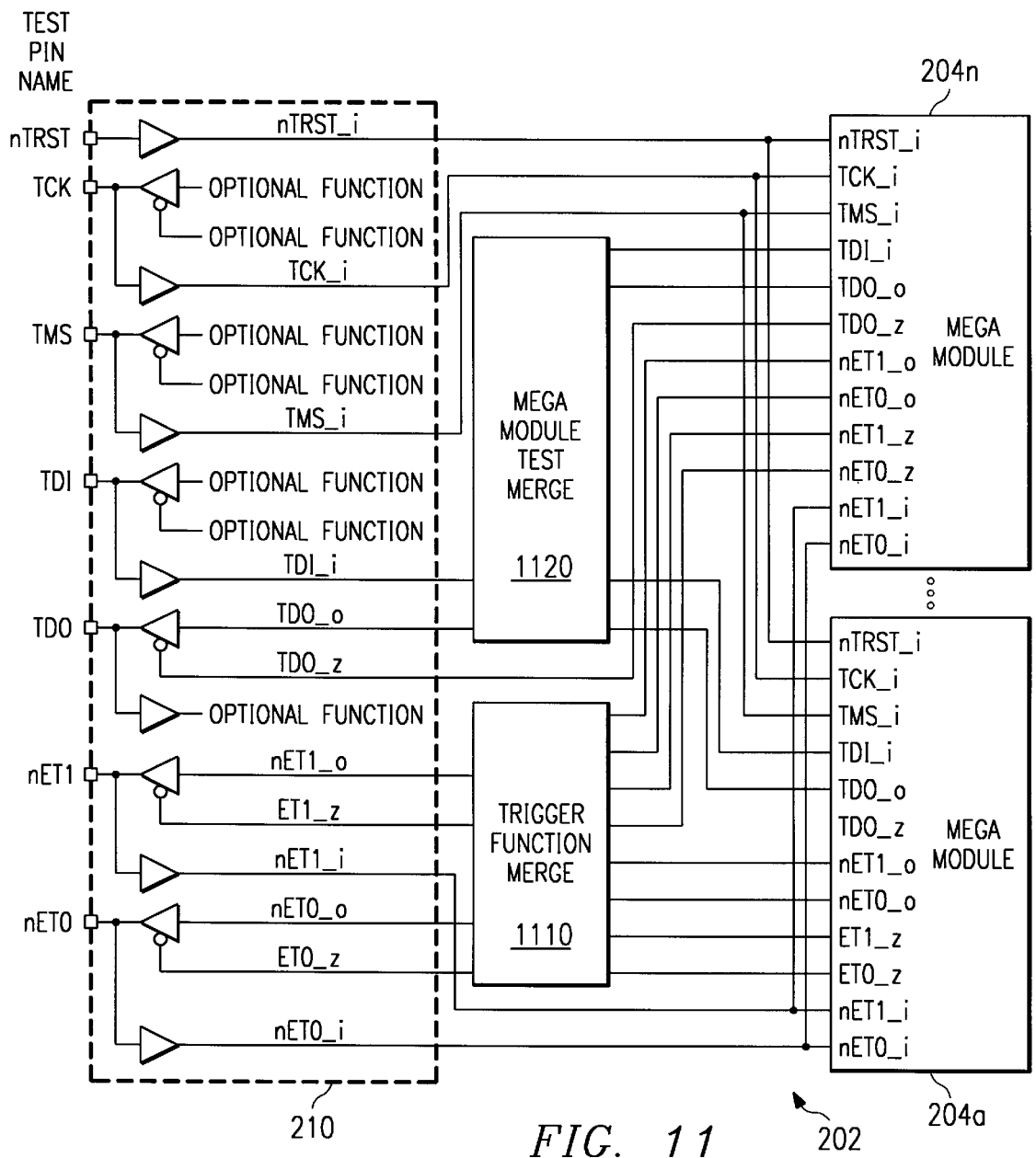
FIG. 11 is a circuit diagram illustrating multiple Mega Modules sharing a single device debug interface.

FIG. 11 shows multiple Mega Modules 204a–204n sharing a single device debug interface 210. Merging all debug interfaces within a device 202 into a single debug interface 210 creates seven debug pin functions (nTRST, TCK, TMS, TDI, TDO, nET1, and nET0). The merging process optimizes device pin count without sacrificing functionality. Mega Module, Device, and Applications Debug Interfaces contain the same seven functions.

Two separate merging functions address trigger channel and test needs. Merging trigger channel signals with trigger function merge circuitry 1110 provides the exact trigger channel capability created from connecting the nETx terminals of N devices. The merging process creates the logical equivalent of the two device configuration with nETx terminals connected externally.

The Mega Module test function merge circuitry 1120 creates test configurations that isolate the individual Mega Modules 204a–n for test. EOMs reconfigure the scan path and other system attributes to facilitate Mega Module testing.

Figure 12:
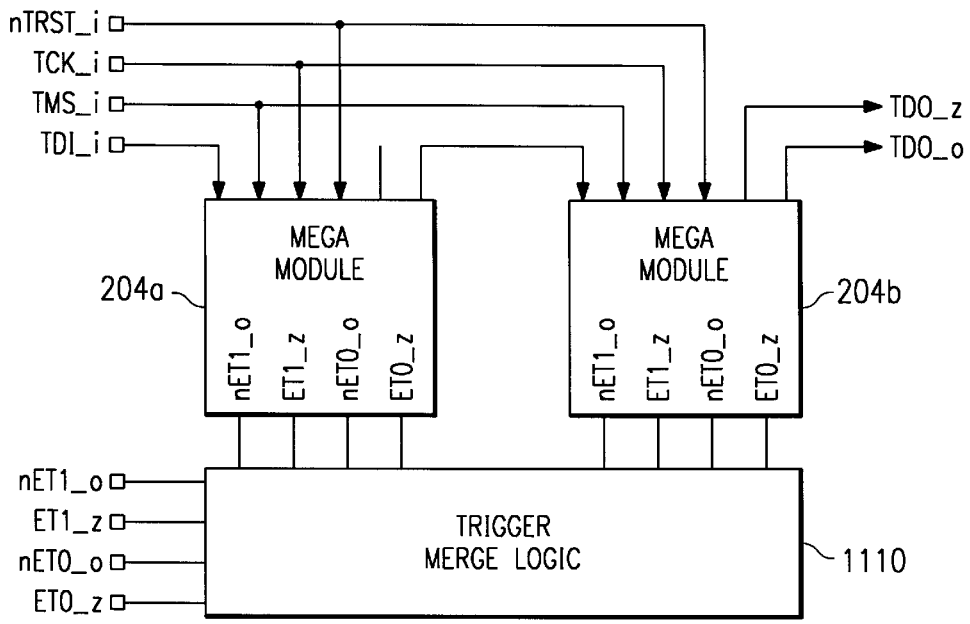
FIG. 12 is a block diagram illustrating Mega Modules providing outputs that can directly control the nETx terminals or jointly control the nETx terminals via merge logic.

Trigger Function Merge: Each device or Mega Module attached to the nETx terminals appears the same to the software. The software views multiple Mega Modules on a single device as separate devices even though they share a single set of nETx terminals. FIG. 12 illustrates Mega Modules 204a–b providing outputs that can directly control the nETx terminals or jointly control the nETx terminals via merge logic 1110 if more than one on-chip Mega Module requires nETx terminal functions.

Figure 13A:
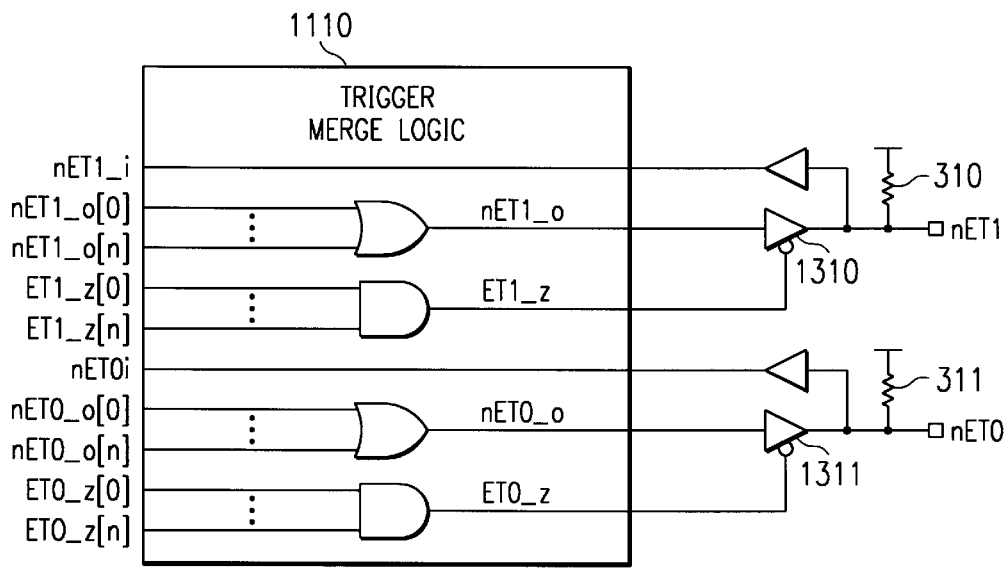
FIGS. 13A–13b are circuit diagrams of the merge logic shown in FIG. 12.
Figure 13B:
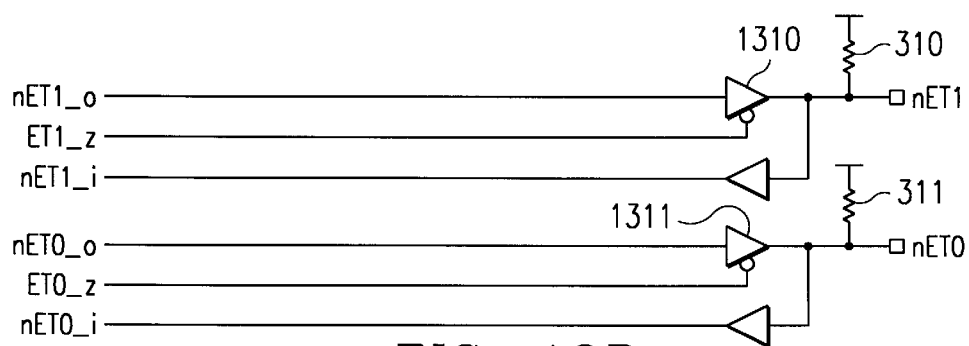

FIGS. 13A–13B are circuit diagrams of merge logic 1110. Two pairs of signals (nET1_o, ET1_z) and (nET0_o, ET0_z) can control output buffers 1310 and 1311 directly as shown in FIG. 13A or share control of output buffers 1310 and 1311 as shown in FIG. 13B. The nET1 and nET0 terminal functions are LOW active signals. The trigger channel inactive state is HIGH. When all nETx outputs are HI-Z, external pull-up resistors establish the inactive state. Mega modules set their respective ETx_z signals LOW when the module requires the nETx terminal be driven. The module drives the nETx_o signal to define the logic level. All modules must place their nETx_o terminals in the LOW state when they are not driving the nETx terminals. This allows the driving module to define the nETx terminal logic level.

Mega Module Test Merge: Individual module test patterns run without modification when the device extended operating modes reconfigure the scan path during test mode. The device scan path, reconfigured to include only the Mega Module under test, allows testing each scannable module as a separate entity making it testable using a standard set of test patterns. EOMs are used to reconfigure the scan paths and make all module terminals necessary to testing accessible at the device pins.

Testing a module individually requires that:
All modules except the module under test have their scan data inputs forced to a one;
The module under test has its scan data input be connected to the TDI input pin, and;
The module under test scan data out sources the TDO output pin.

Figure 14:
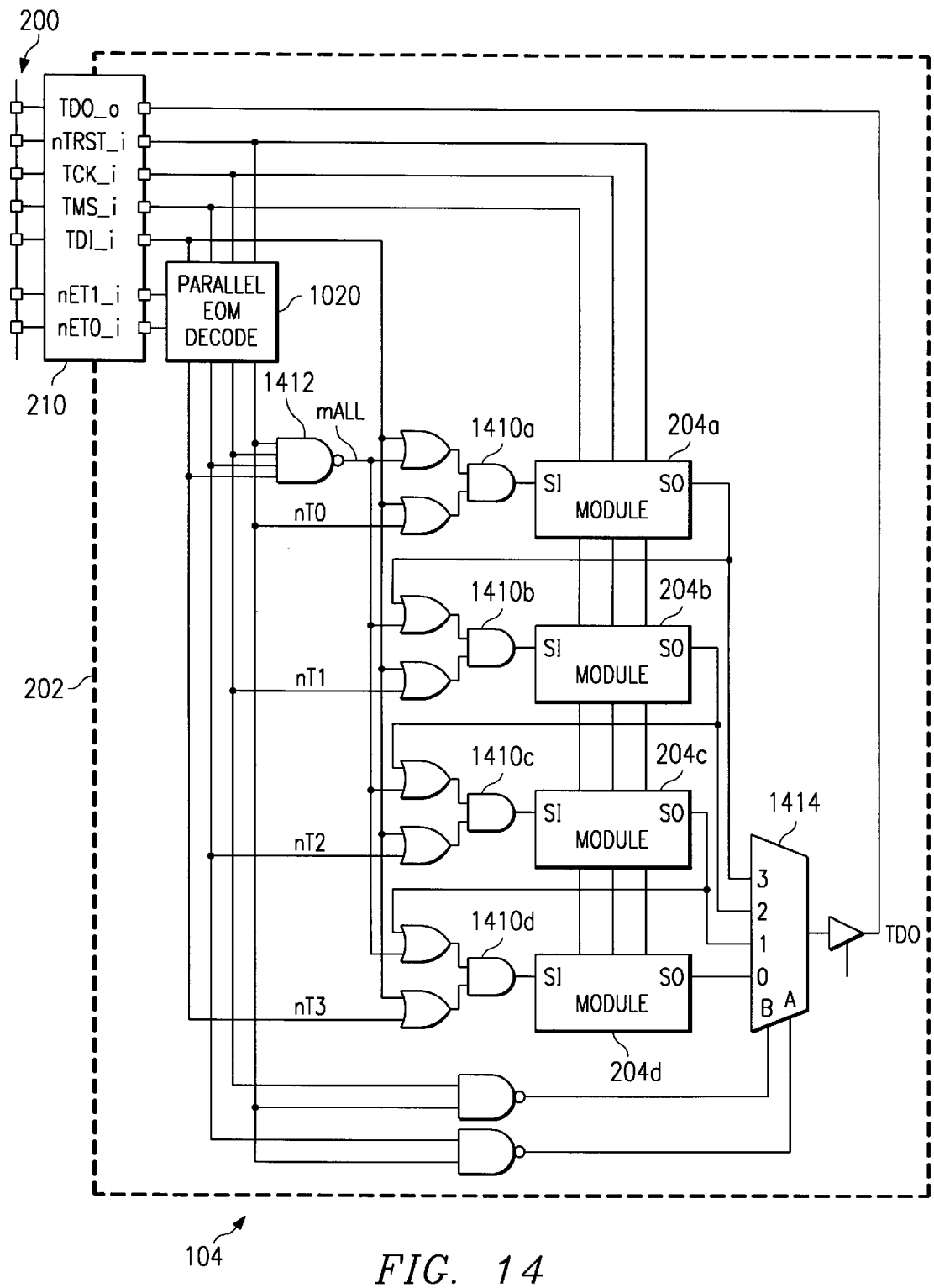
FIG. 14 is a circuit diagram showing a typical configuration of four individually testable modules using parallel defined extended operating modes which have been decoded by a decoder, according to the present invention.

FIG. 14 shows a typical configuration of four individually testable modules 204a–d using parallel defined extended operating modes which have been decoded by decoder 1020. This method capitalizes on the fact that each module supporting IEEE 1149.1 scan contains an IEEE 1149.1 BYPASS op-code of all ONES. Applying a LOW to nTRST, advancing to the IEEE TAP TLR state through state transitions, or an all ONEs instruction register scan loads this instruction register op-code. The BYPASS op-code causes no action within a module. In FIG. 14, signal nALL is asserted (low) in the default state, which provides input TDI_i to all four modules 204a–d and thereby allows a BYPASS op-code to be provided to all modules.

Specifying a Latched EOM that selects one module for test, which asserts one of signals nT0–nT3 and deasserts nALL. This leaves a BYPASS instruction in the IEEE instruction register of all non-selected Mega modules. Supplying a HIGH from gates 1410a–d to the scan data input (SI) of modules that are not being tested continues to place a BYPASS instruction in their instruction registers. These modules effectively ignore IEEE 1149.1 scan operations. The module under test is the only module that responds to IEEE 1149.1 state activity with an action other than detecting a BYPASS instruction. The selected module provides its SO output signal to output TDO via multiplexer 1414.

Creating test pattern sets that are configuration independent requires that all module or Mega Module test patterns be generated with device terminal nTRST high. The scan adapter 102 applies a preamble test pattern to specify the EOM followed by the standard test pattern.

Debug Interface Format Summary

Table 16 summarizes the three debug interface formats which have been described and capabilies of each one.

While the embodiment which has been described enhances the IEEE 1149.1 with two additional signals (nET1 and nET0) and provides up to 48 EOM states, the concepts of the present invention are not restricted to this embodiment. More than two signals may be added with a corresponding increase in EOM states.

Other standard interfaces can be enhanced in a similar manner. A new, or a non-standard, interface can be created or enhanced to include the inventive concepts of the present invention.

TABLE 16

Interface Formats and Test Capabilities

| Interface Class | Capability | | | | |
|---|---|---|---|---|---|
| | Slave Mode | Standard EOMs | Device Test | System Test | Self Emulation |
| Non-Shared | Yes | Yes (48) | Yes | Yes | Yes |
| Partially-Shared | Yes | Yes (12) | Yes | Yes, Reduced Visibility | Yes, Reduced Functionality |
| Fully-Shared | No | Yes (48) | Yes | No | No |

An advantage of the present invention is that modules which have predefined test programs may be combined together on a target system, and the predefined test programs for each module may be re-used without modification.

Another advantage of the present invention is that by sensing and decoding a plurality of terminals in parallel to specifiy a variety of extended operating modes, simple testers which may not be capable of complicated test initialization, such as memory testers, may be interfaced to the target system for testing selected modules, such as a memory module.

Another advantage of the present invention is that at least a second EOM can be selected after a first EOM has been used by toggling a control signal, such an nTRST, at least a second time. Furthermore, a second EOM state can be sensitive to a first EOM state, so that a selection or operation of a second EOM state depends on what first EOM state was previously selected.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of testing an integrated circuit having a target system debug interface which has a plurality of device debug interface terminals, comprising:

selecting a first extended operation mode from a plurality of combinational extended operating modes by placing a first pattern of signals on said target system debug interface;

operating said integrated circuit according to said selected combinational extended operating mode;

selecting a second extended operation mode from a plurality of latched extended operating modes by placing a second pattern of signals on said target system debug interface;

and operating said integrated circuit according to said selected latched extended operating mode in response to said second pattern of signals.

2. The method of claim 1, wherein:

operating said integrated circuit according to a first one of said combinational extended operating modes comprises operating said integrated circuit in its normal operating mode;

operating said integrated circuit according to a second one of said combinational extended operating modes comprises operating said integrated circuit in a peripheral only configuration with a CPU disabled; and operating said integrated circuit according to a third one of said combinational extended operating modes comprises operating said integrated circuit with a plurality of output terminals in a high impedance mode.

3. The method of claim 1, wherein:

operating said integrated circuit according to a first one of said latched extended operating modes comprises operating said integrated circuit so that parametric data related to said integrated circuit is available on at least one of said debug interface terminals;

operating said integrated circuit according to a second one of said latched extended operating modes comprises operating said integrated circuit in a mode to debug software being executed on said integrated circuit; and operating said integrated circuit according to a third one of said latched extended operating modes comprises operating said integrated circuit in a mode to verify correct operation of said integrated circuit.

4. The method of claim 1, wherein said integrated circuit comprises a plurality of modules, wherein each of said plurality of modules has a device debug interface connected to said target system debug interface, wherein selecting a second extended operation mode further comprises selecting a first one of said modules, and wherein operating said integrated circuit according to said selected latched extended operating mode comprises:

testing said selected first module with a standard test sequence applied to said target system debug interface; further comprising:

selecting a third extended operation mode from said plurality of latched extended operating modes by placing a third pattern of signals on said target system debug interface;

selecting a second of said plurality of modules in response to said third pattern of signals; and testing said second selected module with said same standard test sequence applied to said target system debug interface.

5. The method of claim 1, further comprising using a same one of said debug interface terminals to send or receive test data to said integrated circuit and for selecting a first extended operation mode.

6. A method of designing an integrated circuit having a target system debug interface, comprising:

providing a library of device modules which each have a common device debug interface;

selecting a plurality of said device modules for said integrated circuit and connecting said device interface of each of said selected device modules in parallel to said target system debug interface; and providing decode circuitry to select each of said device modules included in said integrated circuit for debug operations in response to a predetermined code placed on said target system debug interface.

7. The method of claim 6, wherein said debug operations comprise: factory test of said integrated circuit prior to installation of said integrated circuit on a target system circuit board;

in-circuit emulation of said integrated circuit after installation on said target system circuit board; and parametric testing a device within said integrated circuit.

* * * * *